(12) United States Patent
Lee et al.

(10) Patent No.: US 11,289,174 B2
(45) Date of Patent: Mar. 29, 2022

(54) STACKED SEMICONDUCTOR DEVICE AND SEMICONDUCTOR SYSTEM INCLUDING THE SAME

(71) Applicant: SK hynix Inc., Gyeonggi-do (KR)

(72) Inventors: Yo-Sep Lee, Gyeonggi-do (KR); Dong-Ha Lee, Gyeonggi-do (KR); Seon-Woo Hwang, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 157 days.

(21) Appl. No.: 16/849,512

(22) Filed: Apr. 15, 2020

(65) Prior Publication Data
US 2021/0193253 A1    Jun. 24, 2021

(30) Foreign Application Priority Data
Dec. 23, 2019  (KR) .......................... 10-2019-0173206

(51) Int. Cl.
*G11C 29/56* (2006.01)
*G11C 29/18* (2006.01)
*G11C 29/12* (2006.01)
*H01L 25/18* (2006.01)
*H01L 23/48* (2006.01)

(52) U.S. Cl.
CPC .... *G11C 29/56012* (2013.01); *G11C 29/1201* (2013.01); *G11C 29/12015* (2013.01); *G11C 29/18* (2013.01); *H01L 23/481* (2013.01); *H01L 25/18* (2013.01); *G11C 2029/5602* (2013.01)

(58) Field of Classification Search
None
See application file for complete search history.

(56) References Cited

FOREIGN PATENT DOCUMENTS

| KR | 10-1416320 | 7/2014 |
|---|---|---|
| KR | 10-2017-0052905 | 5/2017 |

*Primary Examiner* — Guerrier Merant
(74) *Attorney, Agent, or Firm* — IP & T Group LLP

(57) ABSTRACT

A stacked semiconductor device including a plurality of semiconductor chips that are stacked and transfer signals through a plurality of through-electrodes, wherein at least one of the semiconductor chips comprises a first clock generation circuit suitable for generating first and second test clocks by dividing or buffering an external clock according to an operating information signal for indicating a high-speed test operation and a low-speed test operation; a first latch circuit suitable for latching a test control signal according to the first and second test clocks to generate first and second latched signals; and an input signal control circuit suitable for generating first and second internal control signals by re-latching the second latched signal according to the first test clock, and re-latching the first latched signal according to the second test clock.

20 Claims, 14 Drawing Sheets

STACKED SEMICONDUCTOR DEVICE AND SEMICONDUCTOR SYSTEM INCLUDING THE SAME

CROSS-REFERENCE TO RELATED APPLICATIONS

The present application claims priority to Korean Patent Application No. 10-2019-0173206, filed on Dec. 23, 2019, which is incorporated herein by reference in its entirety.

BACKGROUND

1. Field

Various embodiments of the present invention relate to semiconductor design technology, and more particularly, to a semiconductor device supporting a direct access mode.

2. Description of the Related Art

As the semiconductor technology makes dramatic progress, semiconductor integrated devices such as a package are also required to have a higher integration degree and higher performance. To this end, current technology is moving away from a two-dimensional structure in which semiconductor chips are arranged on one plane over a printed circuit board (PCB) by using wires or bumps. Instead, new diverse technologies related to a three-dimensional structure in which a plurality of semiconductor chips are vertically stacked are emerging.

The three-dimensional structure may be implemented by a stacked semiconductor device in which a plurality of semiconductor chips are vertically stacked. The semiconductor chips stacked in a vertical direction are electrically connected to each other through through-electrodes (e.g., through-silicon-vias, TSVs) and mounted on a semiconductor packaging substrate.

Accordingly, a test operation is required to verify whether each semiconductor chip in a stacked semiconductor device is functioning normally.

SUMMARY

Embodiments of the present invention are directed to a stacked semiconductor device capable of performing a high-speed test operation regardless of an operating speed of an external test device, and a semiconductor system including the same.

In accordance with an embodiment of the present invention, a stacked semiconductor device includes a plurality of semiconductor chips that are stacked and transfer signals through a plurality of through-electrodes, wherein at least one of the semiconductor chips comprises: a first clock generation circuit suitable for generating first and second test clocks by dividing or buffering an external clock according to an operating information signal for indicating a high-speed test operation and a low-speed test operation; a first latch circuit suitable for latching a test control signal according to the first and second test clocks to generate first and second latched signals; and an input signal control circuit suitable for generating first and second internal control signals by re-latching the second latched signal according to the first test clock, and re-latching the first latched signal according to the second test clock.

In accordance with an embodiment of the present invention, a semiconductor system includes a first semiconductor device suitable for providing a test control signal in synchronization with an external clock, during a test operation; and a second semiconductor device suitable for performing the test operation based on the external clock and the test control signal, wherein the second semiconductor device comprises: a first clock generation circuit suitable for generating a first test clock by dividing an external clock during a low-speed test operation, and a second test clock by buffering the external clock during a high-speed test operation; a first latch circuit suitable for latching the test control signal according to the first and second test clocks to generate first and second latched signals; and an input signal control circuit suitable for generating first and second internal control signals by re-latching the second latched signal according to the first test clock, and re-latching the first latched signal according to the second test clock.

In accordance with an embodiment of the present invention, a method for testing a stacked semiconductor device using an external clock and a test control signal in synchronization with the external clock, which are provided from an external test device, the method comprises: buffering the external clock during a low-speed test operation to generate first and second test clocks, or dividing a frequency of the external clock during a high-speed test operation to generate the first and second test clocks having opposite phases to each other; latching the test control signal according to the first test clock to generate a first latched signal; latching the test control signal according to the second test clock to generate a second latched signal; re-latching the second latched signal according to the first test clock to generate a first internal control signal; re-latching the first latched signal according to the second test clock to generate a second internal control signal; and operating the stacked semiconductor device based on the first and second internal control signals to perform the low-speed test operation or the high-speed test operation.

These and other features and advantages of the present disclosure will become apparent to those skilled in the art of the invention from the following detailed description in conjunction with the following drawings.

DETAILED DESCRIPTION

Figure 1:
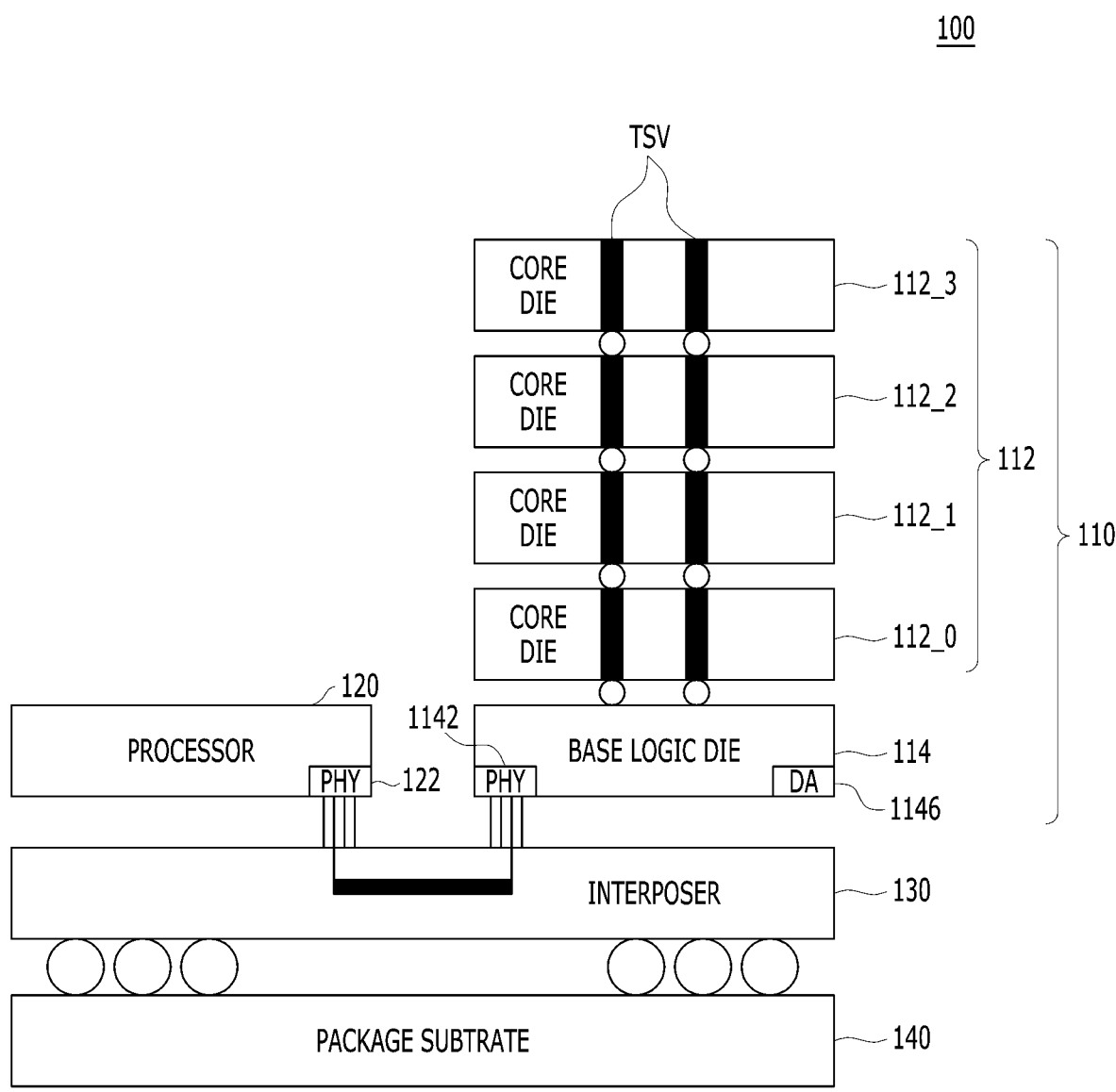
FIG. 1 is a cross-sectional diagram illustrating a semiconductor system in accordance with various embodiments of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It is noted that reference to "an embodiment," "another embodiment" or the like does not necessarily mean only one embodiment, and different references to any such phrase are not necessarily to the same embodiment(s).

It will be understood that, although the terms "first", "second", "third", and so on may be used herein to describe various elements, these elements are not limited by these terms. These terms are used to distinguish one element from another element. Thus, a first element described below could also be termed a second or third element without departing from the spirit and scope of the present invention.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

As used herein, singular forms may include the plural forms as well, and vice versa, unless the context clearly indicates otherwise. The articles 'a' and 'an' as used in this application and the appended claims should generally be construed to mean 'one or more' unless specified otherwise or it is clear from context to be directed to a singular form.

Hereinafter, a semiconductor system including a stacked semiconductor device will be described. The semiconductor system in accordance with the embodiment of the present invention may be embodied in the form of a system-in-package, a multi-chip package, or a system-on-chip, and it may also be embodied in the form of a package-on-package.

FIG. 1 is a cross-sectional diagram illustrating a semiconductor system 100 in accordance with various embodiments of the present invention.

Referring to FIG. 1, the semiconductor system 100 may include a semiconductor device 110, a controller 120, an interposer 130, and a package substrate 140. Although FIG. 1 shows that the semiconductor device 110 is implemented with a stacked semiconductor device, the concept and spirit of the present invention are not limited thereto. According to an embodiment, the semiconductor device 110 may be implemented with a wide-type input/output semiconductor device.

The interposer 130 may be mounted onto the package substrate 140.

The semiconductor device 110 and the controller 120 may be mounted onto the interposer 130.

Since the controller 120 is generally included in diverse processors, such as a Central Processing Unit (CPU), a Graphic Processing Unit (GPU), and an Application Processor (AP), the controller 120 may be also referred to as a processor as designated in FIG. 1.

A physical area (PHY) 1142 of the stacked semiconductor device 110 may be coupled to a physical area (PHY) 122 of the controller 120 via the interposer 130. An interface circuit for communication between the stacked semiconductor device 110 and the controller 120 may be disposed in each of the physical areas 1142 and 122.

The stacked semiconductor device 110 may form a High Bandwidth Memory (HBM). The HBM may have the high bandwidth corresponding to the increased number of I/O units caused by stacking a plurality of dies (i.e., semiconductor chips) in a vertical direction and electrically connecting them through through-electrodes TSVs.

The plurality of dies may include a base logic die 114 and a plurality of core dies 112. The core dies 112 may be sequentially stacked over the base logic die 114, and coupled to each other through the through-electrodes TSVs. Although FIG. 1 shows that four core dies 112, that is, first to fourth core dies 112_0 to 112_3, are stacked, the concept and spirit of the present invention are not limited thereto and the number of the stacked core dies may vary depending on the design of the semiconductor device.

Each of the core dies 112 may be implemented with a memory chip. Each of the core dies 112 may include a plurality of memory cells for storing data and circuits for supporting a core operation on the memory cells. The base logic die 114 may act as an interface between the core dies 112 and the controller 120 so that various functions within the semiconductor system 100, such as a memory management function (e.g., a refresh management function and a power management function for the memory cells), and a timing adjustment function between the core dies 112 and the controller 120, may be performed.

Meanwhile, the base logic die 114 may include the physical area 1142 and a direct access area (DA) 1146. In the physical area 1142, an interface circuit for communication with the controller 120 may be disposed. In the direct access area 1146, an interface circuit for directly testing the stacked semiconductor device 110 may be disposed. The base logic die 114 is also referred to as a buffer die.

Figure 2:
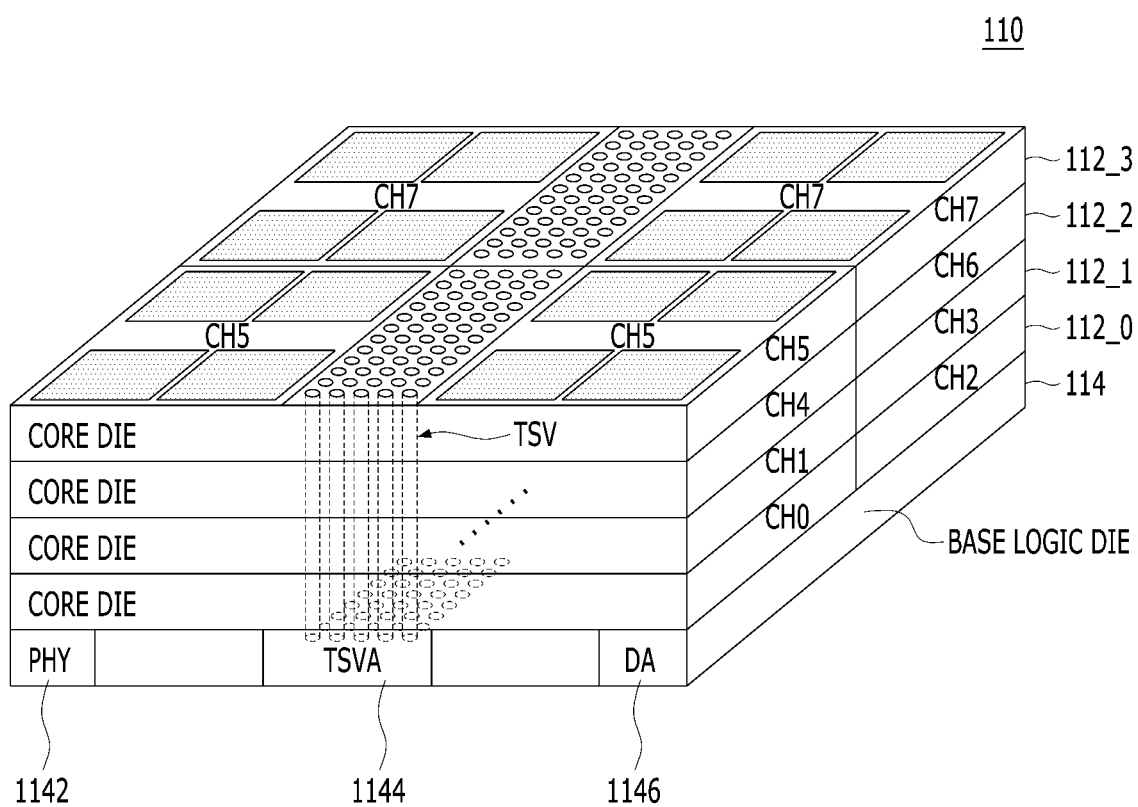
FIG. 2 is a perspective view illustrating a stacked semiconductor device shown in FIG. 1.

FIG. 2 is a perspective view of the stacked semiconductor device 110 shown in FIG. 1.

Referring to FIG. 2, each of the first to fourth core dies 112_0 to 112_3 may include one or more channels. In the example of FIG. 2, as one core die includes two channels, the stacked semiconductor device 110 may have first to eighth channels CH0 to CH7. For example, the first core die 112_0 may include memory areas corresponding to the first and third channels CH0 and CH2, and the second core die 112_1 may include memory areas corresponding to the second and fourth channels CH1 and CH3. The third core die 112_2 may include memory areas corresponding to the fifth and seventh channels CH4 and CH6, and the fourth core die 112_3 may include memory areas corresponding to the sixth and eighth channels CH5 and CH7.

For example, first to eighth memory banks may correspond to each channel. Further, a plurality of through-electrodes TSVs passing through the first to fourth core dies 112_0 to 112_3 may be disposed corresponding to the first to eighth channels CH0 to CH7, respectively. When each channel has a bandwidth of 128 bits (i.e., two 128-bit channels per die), the through-electrodes TSVs and corresponding I/O units may be configured to transfer 1024 bits of data. Each channel may be similar to a standard DDR interface, but may be completely independent and therefore each channel within one stacked semiconductor device and even within one die may operate at different frequency and/or different timings.

The base logic die 114 may communicate with the controller 120 (see FIG. 1). For example, the base logic die 114 may receive commands, addresses, and data from the controller 120, and provide the received commands, addresses, and data to the first to fourth core dies 112_0 to 112_3.

A physical area (PHY) 1142, a TSV area (TSVA) 1144, and a direct access area (DA) 1146 may be disposed in the base logic die 114. The physical area (PHY) 1142 may be the same part as the physical area (PHY) 1142 shown in FIG. 1, and the direct access area (DA) 1146 may be the same part as the direct access area (DA) 1146 shown in FIG. 1.

The physical area 1142 may be provided with an I/O circuit for interfacing with the controller 120. The physical area 1142 may be disposed in a first edge area of the base logic die 114, adjacent to the controller 120. The direct access area 1146 may be provided with an I/O circuit for directly interfacing with an external test device (not shown). The direct access area 1146 may be disposed in a second edge area of the base logic die 114, adjacent to the external test device.

The second edge area may be disposed in a direction which is opposite to the first edge area. The TSV area 1144 may be an area for interfacing with the through-electrodes TSVs passing through the first to fourth core dies 112_0 to 112_3. The TSV area 1144 may be disposed between the physical area 1142 and the direct access area 1146, that is, the TSV area 1144 may be disposed at the central area of the base logic die 114.

The physical area 1142 may transfer signals received from the controller 120 to the TSV area 1144. The direct access area 1146 may transfer a test signal received from the external test device to the TSV area 1144. The TSV area 1144 may perform a predetermined signal processing operation, for example, a buffering operation, on the signal received from the physical area 1142 or the test signal received from the direct access area 1146 to transfer the buffered signals to the first to fourth core dies 112_0 to 112_3 through the through-electrodes TSVs.

Figure 3:
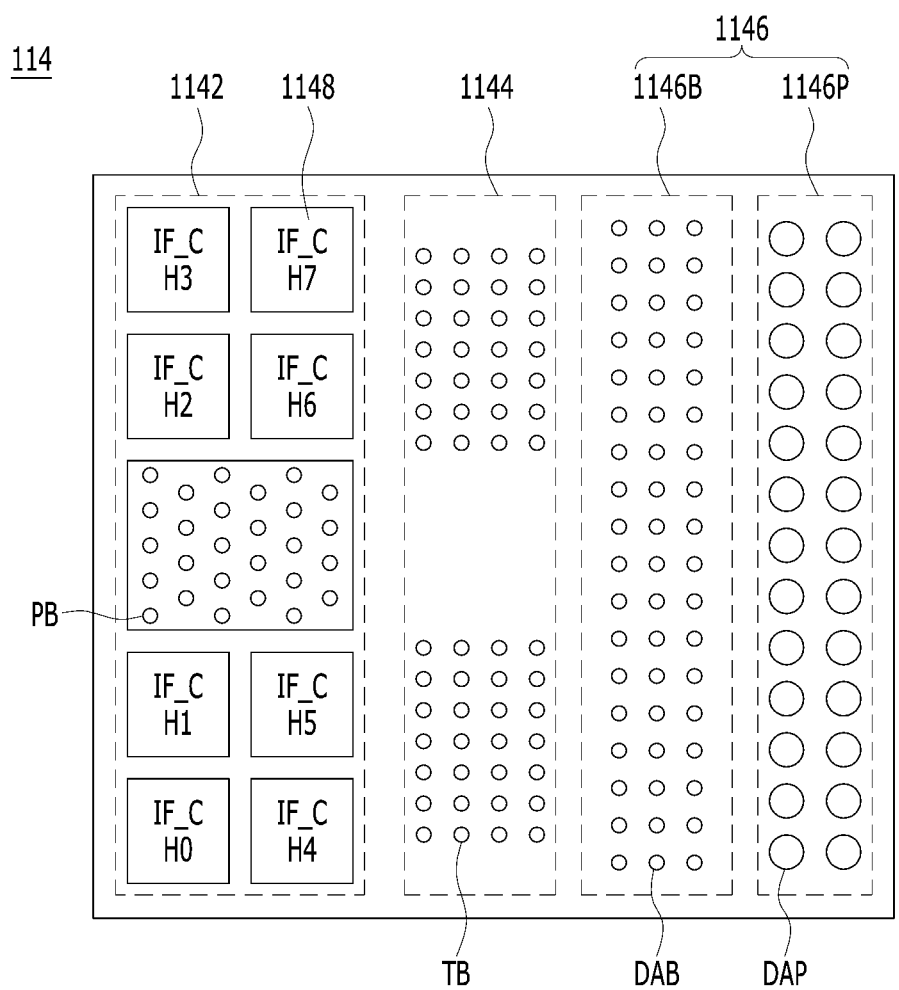
FIG. 3 is a plane view for describing bumps disposed on a base logic die shown in FIG. 2.

FIG. 3 is a plane view for describing bumps disposed on the base logic die 114 shown in FIG. 2.

Referring to FIG. 3, the physical area 1142, the TSV area 1144, and the direct access area 1146 may be disposed in the base logic die 114. In the physical area 1142, channel interface areas IF_CH0 to IF_CH7 for interfacing with the first to eighth channels CH0 to CH7 of the first to fourth core dies 112_0 to 112_3 may be disposed.

A plurality of PHY bumps PB for interfacing with the controller 120 may be formed on the physical area 1142. A plurality of TSV bumps TB for interfacing with the through-electrodes TSVs may be formed on the TSV area 1144. The direct access area 1146 may include a DA bump area 1146B and a DA probing area 1146P. In the DA bump area 1146B, a plurality of DA bumps DAB for interfacing with the external test device through the interposer 130 to test the stacked semiconductor device 110, may be formed on the direct access area 1146. In the DA probing area 1146P, a plurality of DA pads DAP for interfacing with the external test device without going through the interposer 130 to test the stacked semiconductor device 110, may be formed on the direct access area 1146. That is, the external test device may directly access the stacked semiconductor device 110 using the DA bumps DAB or the DA pads DAP. The DA bumps DAB may be provided to test the stacked semiconductor device 110 at a package level, and the DA pads DAP may be provided to test the stacked semiconductor device 110 at a wafer level. The PHY bumps PB and the DA bumps DB may be formed of micro-bumps, and the DA pads DAP may be formed of pad larger than the micro-bumps. For example, the DA pads DAP may be relatively larger in physical size but fewer in number than the PHY bumps PB and the DA bumps DB.

Meanwhile, a system vendor may require a mode of directly inputting data to a core die without going through the controller 120 in order to evaluate only the characteristics of the memory areas of the respective core dies 112_0 to 112_3. In short, a test operation may be performed by entering a direct access (DA) mode to test memory cells in a memory area corresponding to each channel. In the DA mode, a test signal may be applied to each of the core dies 112_0 to 112_3 through the DA bumps DAB or the DA pads DAP of the direct access area 1146, and, then, through the TSV bumps TB and the through-electrodes TSVs of the TSV area 1144.

In the DA mode, a test signal may be transferred to the physical area 1142 through the DA bumps DAB or the DA pads DAP of the direct access area 1146, and, then transferred to the through-electrodes TSVs of the TSV area 1144 through the interface circuit of the channel interface areas IF_CH0 to IF_CH7 included in the physical area 1142. Herein, there is a high possibility that a skew may occur between a command/address/data and a clock/strobe signal because the physical area 1142 is physically far away from the DA bumps DAB or the DA pads DAP. Therefore, it may be necessary to transfer a signal at an exact timing between the direct access area 1146 and the physical area 1142. Further, when the test signal is applied through the DA bumps DAB or DA pads DAP, an internal test operation may be constrained by the operating speed of the external test device. For example, if the external test device is operating at low speed, the test operation may be performed by placing a clock frequency doubler inside the base logic die 114. However, a duty ratio of complementary clocks generated by such a clock frequency doubler may be not constant and a cross-point of the complementary clocks may be not centered, causing the characteristics of the test operation to be degraded.

Hereinafter, a stacked semiconductor device and a semiconductor system capable of performing a high-speed test operation regardless of an operating speed of an external test device will be described. In the proposed embodiments, commands and addresses may be defined as "control signals", and for the sake of convenience in description, the proposed embodiments will be described with a focus on the input/output of commands/addresses and clocks, except for data.

Figure 4:
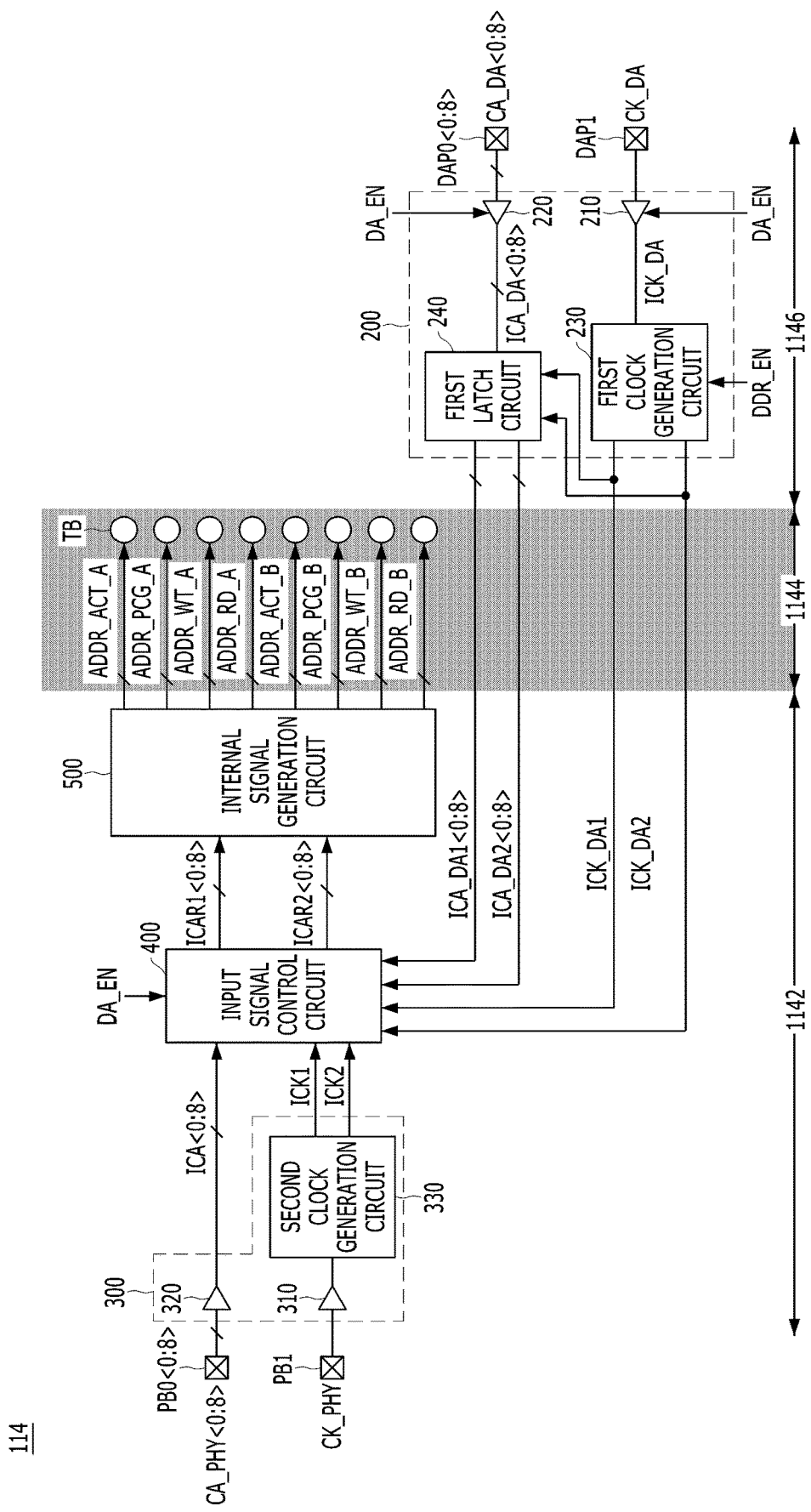
FIG. 4 is a configuration diagram illustrating a base logic die in accordance with various embodiments of the present invention.

FIG. 4 is a configuration diagram illustrating a base logic die 114 in accordance with various embodiments of the present invention.

Referring to FIG. 4, as described above, the physical area 1142, the TSV area 1144, and the direct access area 1146 may be disposed in the base logic die 114. On the physical area 1142, a plurality of first PHY bumps PB0<0:8> for receiving a normal control signal CA_PHY<0:8>, and a second PHY bump PB1 for receiving a normal clock CK_PHY, during a normal operation, may be disposed. On the TSV area 1144, a plurality of TSV bumps TB for interfacing with the through-electrodes TSVs may be disposed. The direct access area 1146 may include a DA bump area (1146B of FIG. 3) and a DA probing area (1146P of FIG. 3). In case where the direct access area 1146 of FIG. 4 is the DA probing area 1146P, a plurality of first DA pads DAP0<0:8> for receiving a test control signal CA_DA<0:8>, and a second DA pad DAP1 for receiving an external clock CK_DA, during a test operation, may be disposed on the DA probing area 1146P. Meanwhile, in case where the direct access area 1146 is the DA bump area 1146B, the test control signal CA_DA<0:8> and the external test clock CK_DA may be inputted through a plurality of DA bumps DAB. Although the embodiment of FIG. 4 shows that the normal clock CK_PHY or the external clock CK_DA is inputted through a single bump or pad, the concept and spirit of the present invention are not limited thereto. According to an embodiment, differential clocks may be inputted through at least two bumps or pads.

The base logic die 114 may include a first input circuit 200, a second input circuit 300, an input signal control circuit 400, and an internal signal generation circuit 500.

The first input circuit 200 may receive the test control signal CA_DA<0:8> through the first DA pads DAP0<0:8>, and the external clock CK_DA through the second DA pad DAP1, during the test operation. The first input circuit 200 may be enabled according to a mode signal DA_EN for indicating the test operation and the normal operation. The mode signal DA_EN may transition to a logic high level during the test operation, while transitioning to a logic low level during the normal operation. The first input circuit 200 may be enabled when the mode signal DA_EN transitions to a logic high level during the test operation, and receives the test control signal CA_DA<0:8> and the external clock CK_DA. The first input circuit 200 may be disposed in the direct access area 1146.

In detail, the first input circuit 200 may include a first clock buffer 210, a first data buffer 220, a first clock generation circuit 230, and a first latch circuit 240.

The first clock buffer 210 may generate an internal clock ICK_DA by buffering the external clock CK_DA inputted through the second DA pad DAP1. The first data buffer 220 may generate a buffered test control signal ICA_DA<0:8> by buffering the test control signal CA_DA<0:8> inputted through the first DA pads DAP0<0:8>. The first clock buffer 210 and the first data buffer 220 may be enabled according to the mode signal DA_EN. That is, the first clock buffer 210 and the first data buffer 220 may perform the buffering operation when the mode signal DA_EN transitions to a logic high level during the test operation.

The first clock generation circuit 230 may receive the internal clock ICK_DA to generate first and second test clocks ICK_DA1 and ICK_DA2, according to an operating information signal DDR_EN for indicating a high-speed test operation and a low-speed test operation. The operating information signal DDR_EN may transition to a logic high level during the low-speed test operation, while transitioning to a logic low level during the high-speed test operation. The first clock generation circuit 230 may buffer the internal clock ICK_DA to generate the first and second test clocks ICK_DA1 and ICK_DA2, when the operating information signal DDR_EN transitions to a logic high level during the low-speed test operation. The first clock generation circuit 230 may divide a frequency of the internal clock ICK_DA to generate the first and second test clocks ICK_DA1 and ICK_DA2, when the operating information signal DDR_EN transitions to a logic low level during the high-speed test operation. The first latch circuit 240 may latch the buffered test control signal ICA_DA<0:8> according to the first and second test clocks ICK_DA1 and ICK_DA2, and output first and second latched signals ICA_DA1<0:8> and ICA_DA2<0:8>, respectively. The detailed configuration of the first input circuit 200 will be described with reference to FIG. 5.

As described above, the first and second test clocks ICK_DA1 and ICK_DA2, and the first and second latched signals ICA_DA1<0:8> and ICA_DA2<0:8>, are generated in the direct access area 1146 and provided to the physical area 1142, during the test operation.

The second input circuit 300 may receive the normal control signal CA_PHY<0:8> through the first PHY bumps PB0<0:8>, and the normal clock CK_PHY through the second PHY bump PB1, during the normal operation. The second input circuit 300 may be disposed in the physical area 1142.

In detail, the second input circuit 300 may include a second clock buffer 310, a second data buffer 320, and a second clock generation circuit 330.

The second clock buffer 310 may generate an internal normal clock by buffering the normal clock CK_PHY inputted through the second PHY bump PB1. The second data buffer 320 may generate a buffered normal control signal ICA<0:8> by buffering the normal control signal CA_PHY<0:8> inputted through the first PHY bumps PB0<0:8>. The second clock generation circuit 330 may generate first and second normal divided clocks ICK1 and ICK2 having opposite phases to each other, by dividing a frequency of the internal normal clock. The second clock generation circuit 330 may be implemented with a frequency divider for dividing a frequency of a clock.

The input signal control circuit 400 may re-latch (i.e., re-time) the first and second latched signals ICA_DA1<0:8> and ICA_DA2<0:8> according to the first and second test clocks ICK_DA1 and ICK_DA2, or may re-latch (i.e., re-time) the buffered normal control signal ICA<0:8> according to the first and second normal divided clocks ICK1 and ICK2. When the mode signal DA_EN transitions to a logic high level during the test operation, the input signal control circuit 400 may generate internal control signals ICAR1<0:8> and ICAR2<0:8> by re-latching the second latched signal ICA_DA2<0:8> according to the first test clock ICK_DA1, and re-latching the first latched signal ICA_DA1<0:8> according to the second test clock ICK_DA2. When the mode signal DA_EN transitions to a logic low level during the normal operation, the input signal control circuit 400 may generate the internal control signals ICAR1<0:8> and ICAR2<0:8> by re-latching the buffered normal control signal ICA<0:8> according to the first normal divided clock ICK1, and by re-latching the buffered normal control signal ICA<0:8> according to the second normal divided clock ICK2. The detailed configuration of the input signal control circuit 400 will be described with reference to FIG. 6.

Meanwhile, the re-timing operation may include a buffering operation of storing/latching and, then, outputting command/address/data which are transferred from the direct access area 1146 to the physical area 1142. When the transferred command/address/data are stored/latched and then outputted, the timing of the transferred command/address/data may be re-aligned, and a skew may be reduced. That is, the command/address/data exchanged between two different areas or devices may be re-aligned to improve the reliability of the semiconductor device 110. In the embodiment of the present invention, the input signal control circuit 400 may reduce/minimize the skew of signals provided from direct access area 1146 to the physical area 1142, due to a re-timing operation during the test operation. In particular, the input signal control circuit 400 may receive the first and second latched signals ICA_DA1<0:8> and ICA_DA2<0: 8> by swapping the first latched signal ICA_DA1<0:8> with the second latched signal ICA_DA2<0:8>, which are transferred from the direct access area 1146 apart therefrom. That is, the input signal control circuit 400 may additionally obtain a timing margin between the clock and the signal by re-timing the second latched signal ICA_DA2<0:8> according to the first test clock ICK_DA1, and re-timing the first latched signal ICA_DA1<0:8> according to the second test clock ICK_DA2.

The internal signal generation circuit 500 may decode the internal control signals ICAR1<0:8> and ICAR2<0:8> to generate a plurality of internal commands/addresses ADDR_ACT_A, ADDR_PCG_A, ADDR_WT_A, ADDR_RD_A, ADDR_ACT_B, ADDR_PCG_B, ADDR_WT_B, and ADDR_RD_B. The internal commands/addresses ADDR_ACT_A, ADDR_PCG_A, ADDR_WT_A, ADDR_RD_A, ADDR_ACT_B, ADDR_PCG_B, ADDR_WT_B, and ADDR_RD_B may be provided to the through-electrodes TSVs in the TSV area 1144. The detailed configuration of the internal signal generation circuit 500 will be described with reference to FIG. 7.

Figure 5:
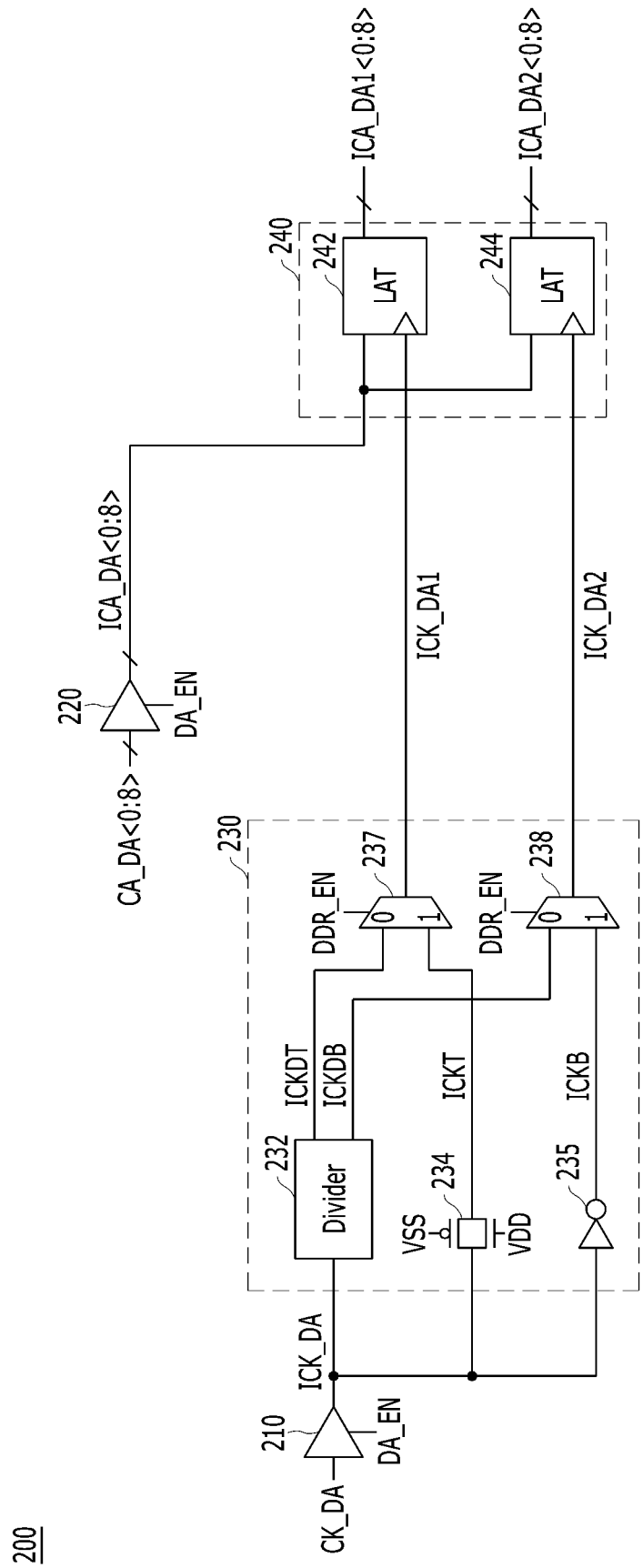
FIG. 5 is a detailed circuit diagram illustrating a first input circuit shown in FIG. 4.

FIG. 5 is a detailed circuit diagram illustrating the first input circuit 200 shown in FIG. 4.

Referring to FIG. 5, the first input circuit 200 may include the first clock buffer 210, the first data buffer 220, the first clock generation circuit 230, and the first latch circuit 240.

The first clock generation circuit 230 may include a divider 232, a first transmitter 234, a second transmitter 235, a first selector 237, and a second selector 238.

The divider 232 may generate a first divided test clock ICKDT and a second divided test clock ICKDB, having opposite phases to each other, by dividing a frequency of the internal clock ICK_DA transferred from the first clock buffer 210. The divider 232 may be implemented with a frequency divider. The first transmitter 234 may transfer the internal clock ICK_DA as a first buffer clock ICKT, and the second transmitter 235 may invert the phase of the internal clock ICK_DA to output the inverted internal clock as a second buffer clock ICKB. The first transmitter 234 may be implemented with a transfer gate which maintains a turned-on state according to a supply voltage (VDD) and a ground voltage (VSS). The second transmitter 235 may be implemented with an inverter. The first selector 237 may select one of the first divided test clock ICKDT and the first buffer clock ICKT in response to the operating information signal DDR_EN to output the selected clock as the first test clock ICK_DA1. The second selector 238 may select one of the second divided test clock ICKDB and the second buffer clock ICKB in response to the operating information signal DDR_EN to output the selected clock as the second test clock ICK_DA2.

Moreover, an external test device (not shown) may transmit the test control signal CA_DA<0:8> in response to any of a rising edge and a falling edge of the external clock CK_DA, during a high-speed test operation. That is, the external test device may perform a data transfer operation of a single data rate (SDR) type during the high-speed test operation. On the contrary, the external test device may transmit the test control signal CA_DA<0:8> in response to both of the rising edge and the falling edge of the external clock CK_DA, during a low-speed test operation. In other words, the external test device may perform a data transfer operation of a double data rate (DDR) type during the low-speed test operation.

When the operating information signal DDR_EN transitions to a logic low level during the high-speed test operation, the first selector 237 may selectively output the first divided test clock ICKDT as the first test clock ICK_DA1, and the second selector 238 may selectively output the second divided test clock ICKDB as the second test clock ICK_DA2.

When the operating information signal DDR_EN transitions to a logic high level during the low-speed test operation, the first selector 237 may selectively output the first buffer clock ICKT as the first test clock ICK_DA1, and the second selector 238 may selectively output the second buffer clock ICKB as the second test clock ICK_DA2. That is, during the high-speed test operation, the external test device performs the data transfer operation of the SDR type, and the first clock generation circuit 230 may divide the frequency of the internal clock ICK_DA to generate the first and second test clocks ICK_DA1 and ICK_DA2 having opposite phases to each other. During the low-speed test operation, the external test device performs the data transfer operation of the DDR type, and the first clock generation circuit 230 may buffer the internal clock ICK_DA to generate the first and second test clocks ICK_DA1 and ICK_DA2 having opposite phases to each other.

The first latch circuit 240 may include a first latch 242 and a second latch 244. The first latch 242 may latch the buffered test control signal ICA_DA<0:8> in response to the first test clock ICK_DA1, to output the first latched signal ICA_DA1<0:8>. The second latch 244 may latch the buffered test control signal ICA_DA<0:8> in response to the second test clock ICK_DA2, and output the second latched signal ICA_DA2<0:8>.

Figure 6:
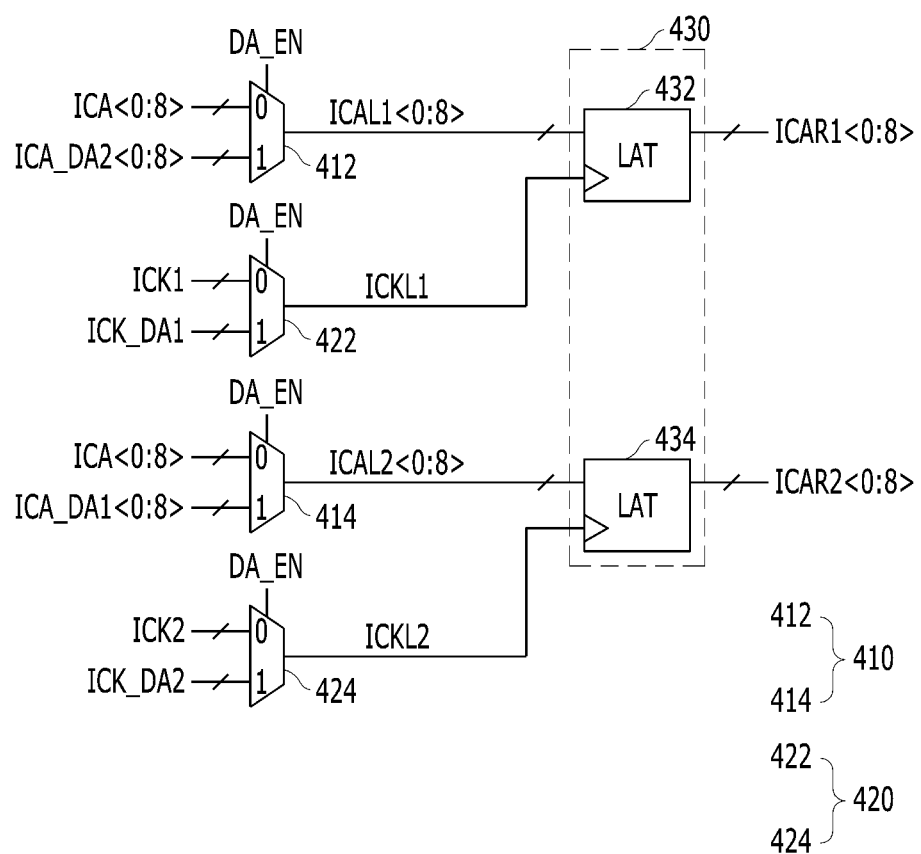
FIG. 6 is a detailed circuit diagram illustrating an input signal control circuit shown in FIG. 4.

FIG. 6 is a detailed circuit diagram illustrating the input signal control circuit 400 shown in FIG. 4.

Referring to FIG. 6, the input signal control circuit 400 may include a signal selection circuit 410, a clock selection circuit 420, and a second latch circuit 430.

The signal selection circuit 410 may include a first signal selector 412 and a second signal selector 414. The first signal selector 412 may select one of the buffered normal control signal ICA<0:8> and the second latched signal ICA_DA2<0:8> according to the mode signal DA_EN to output the selected signal as a first selected signal ICAL1<0:8>. The second signal selector 414 may select one of the buffered normal control signal ICA<0:8> and the first latched signal ICA_DA1<0:8> according to the mode signal DA_EN to output the selected signal as a second selected signal ICAL2<0:8>. At this time, the buffered normal control signal ICA<0:8> may be transferred from the second data buffer (320 of FIG. 4) during the normal operation, and the first and second latched signals ICA_DA1<0:8> and ICA_DA2<0:8> may be transferred from the first latch circuit (240 of FIG. 4) in the direct access area 1146, during the test operation. When the mode signal DA_EN transitions to a logic low level during the normal operation, the signal selection circuit 410 may selectively output the buffered normal control signal ICA<0:8> as the first and second selected signals ICAL1<0:8> and ICAL2<0:8>. When the mode signal DA_EN transitions to a logic high level during the test operation, the signal selection circuit 410 may selectively output the second latched signal ICA_DA2<0:8> as the first selected signal ICAL1<0:8>, and selectively output the first latched signal ICA_DA1<0:8> as the second selected signal ICAL2<0:8>. That is, when receiving the first and second latched signals ICA_DA1<0:8> and ICA_DA2<0:8> which are transferred from the direct access area 1146 apart therefrom, the signal selection circuit 410 may swap the first latched signal ICA_DA1<0:8> with the second latched signal ICA_DA2<0:8>.

The clock selection circuit 420 may include a first clock selector 422 and a second clock selector 424. The first clock selector 422 may select one of the first normal divided clock ICK1 and the first test clock ICK_DA1 according to the mode signal DA_EN to output the selected clock as a first selected clock ICKL1. The second clock selector 424 may select one of the second normal divided clock ICK2 and the second test clock ICK_DA2 according to the mode signal DA_EN to output the selected clock as a second selected clock ICKL2. At this time, the first and second normal divided clocks ICK1 and ICK2 may be transferred from the second clock generation circuit (330 of FIG. 4) during the normal operation, and the first and second test clocks ICK_DA1 and ICK_DA2 may be transferred from the first clock generation circuit 230 (240 of FIG. 4) in the direct access area 1146, during the test operation. When the mode signal DA_EN transitions to a logic low level during the normal operation, the clock selection circuit 420 may selectively output the first normal divided clock ICK1 as the first selected clock ICKL1, and selectively output the second normal divided clock ICK2 as the second selected clock ICKL2. When the mode signal DA_EN transitions to a logic high level during the test operation, the clock selection circuit 420 may selectively output the first test clock ICK_DA1 as the first selected clock ICKL1, and selectively output the second test clock ICK_DA2 as the second selected clock ICKL2.

The second latch circuit 430 may include a third latch 432 and a fourth latch 434. The third latch 432 may latch the first selected signal ICAL1<0:8> according to the first selected clock ICKL1 to output the latched signal as a first internal control signal ICAR1<0:8>. The fourth latch 434 may latch the second selected signal ICAL2<0:8> according to the second selected clock ICKL2 to output the latched signal as a second internal control signal ICAR2<0:8>.

As described above, the input signal control circuit 400 may receive the first latched signal ICA_DA1<0:8> and the second latched signal ICA_DA2<0:8> swapped with each other, both of which are transferred from the direct access area 1146, during the test operation. Then, the input signal control circuit 400 may generate the first and second internal control signals ICAR1<0:8> and ICAR2<0:8> by re-timing (i.e., re-latching) the second latched signal ICA_DA2<0:8> and the first latched signal ICA_DA1<0:8> according to the first and second test clocks ICK_DA1 and ICK_DA2. Accordingly, it is possible to obtain a timing margin between the clock and the signal.

Figure 7:
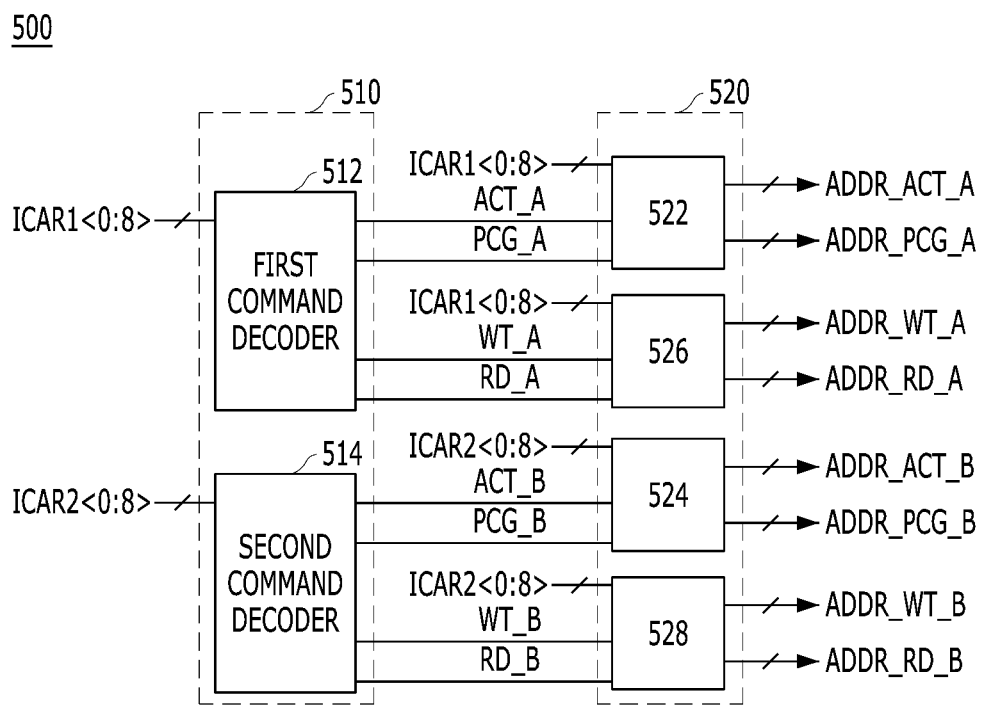
FIG. 7 is a detailed circuit diagram illustrating an internal signal generation circuit shown in FIG. 4.

FIG. 7 is a detailed circuit diagram illustrating the internal signal generation circuit 500 shown in FIG. 4.

Referring to FIG. 7, the internal signal generation circuit 500 may include a decoding circuit 510 and a command/address generation circuit 520.

The decoding circuit 510 may generate a plurality of internal commands ACT_A, PCG_A, WT_A, RD_A, ACT_B, PCG_B, WT_B, and RD_B by decoding the first and second internal control signals ICAR1<0:8> and ICAR2<0:8>. The plurality of internal commands may include active commands ACT_A and ACT_B, pre-charge commands PCG_A and PCG_B, write commands WT_A and WT_B, and read commands RD_A and RD_B. The active commands ACT_A and ACT_B, and the pre-charge commands PCG_A and PCG_B may be defined as a row-based command, and the write commands WT_A and WT_B, and the read commands RD_A and RD_B may be defined as a column-based command.

The command/address generation circuit 520 may generate the plurality of internal commands/addresses ADDR_ACT_A, ADDR_PCG_A, ADDR_WT_A, ADDR_RD_A, ADDR_ACT_B, ADDR_PCG_B, ADDR_WT_B, and ADDR_RD_B, corresponding to the first and second internal control signals ICAR1<0:8> and ICAR2<0:8>, according to the internal commands ACT_A, PCG_A, WT_A, RD_A, ACT_B, PCG_B, WT_B, and RD_B.

In detail, the decoding circuit 510 may include a first command decoder 512 and a second command decoder 514. The first command decoder 512 may generate a plurality of first internal commands ACT_A, PCG_A, WT_A, and RD_A by decoding the first internal control signal ICAR1<0:8>. The second command decoder 514 may generate a plurality of second internal commands ACT_B, PCG_B, WT_B, and RD_B by decoding the second internal control signal ICAR2<0:8>.

The command/address generation circuit 520 may include first and second row-based generation circuits 522 and 524, and first and second column-based generation circuits 526 and 528. The first row-based generation circuit 522 may generate the internal commands/addresses ADDR_ACT_A and ADDR_PCG_A corresponding to the first internal control signal ICAR1<0:8>, according to the row-based commands ACT_A and PCG_A among the first internal commands ACT_A, PCG_A, WT_A, and RD_A. The second row-based generation circuit 524 may generate the internal commands/addresses ADDR_ACT_B and ADDR_PCG_B corresponding to the second internal control signal ICAR2<0:8>, according to the row-based commands ACT_B and PCG_B among the second internal commands ACT_B, PCG_B, WT_B, and RD_B. The first column-based generation circuit 526 may generate the internal commands/addresses ADDR_WT_A and ADDR_RD_A corresponding to the first internal control signal ICAR1<0:8>, according to the column-based commands WT_A and RD_A among the first internal commands ACT_A, PCG_A, WT_A, and RD_A. The second column-based generation circuit 528 may generate the internal commands/addresses ADDR_WT_B and ADDR_RD_B corresponding to the second internal control signal ICAR2<0:8>, according to the column-based commands WT_B and RD_B among the second internal commands ACT_B, PCG_B, WT_B, and RD_B.

For reference, the internal commands/addresses ADDR_ACT_A and ADDR_PCG_A generated by the first row-based generation circuit 522, and the internal commands/addresses ADDR_ACT_B and ADDR_PCG_B generated by the second row-based generation circuit 524, may be transferred to the respective core dies (112 of FIG. 1) through the through-electrodes TSVs. Each core die 112 may merge the internal commands/addresses ADDR_ACT_A and ADDR_PCG_A, and the internal commands/addresses ADDR_ACT_B and ADDR_PCG_B, and may perform an active operation or pre-charge operation according to the merged internal commands/addresses. Likewise, the internal commands/addresses ADDR_WT_A and ADDR_RD_A generated by the first column-based generation circuit 526, and the internal commands/addresses ADDR_WT_B and ADDR_RD_B generated by the second column-based generation circuit 528, may be transferred to the respective core dies 112 through the through-electrodes TSVs. Each core die 112 may merge the internal commands/ addresses ADDR_WT_A and ADDR_RD_A, and the internal commands/addresses ADDR_WT_B and ADDR_RD_B, and may perform a write operation or read operation according to the merged internal commands/addresses.

Hereinafter, referring to FIGS. 1 to 10, an operation of a semiconductor system in accordance with various embodiments of the present invention will be described.

Figure 8:
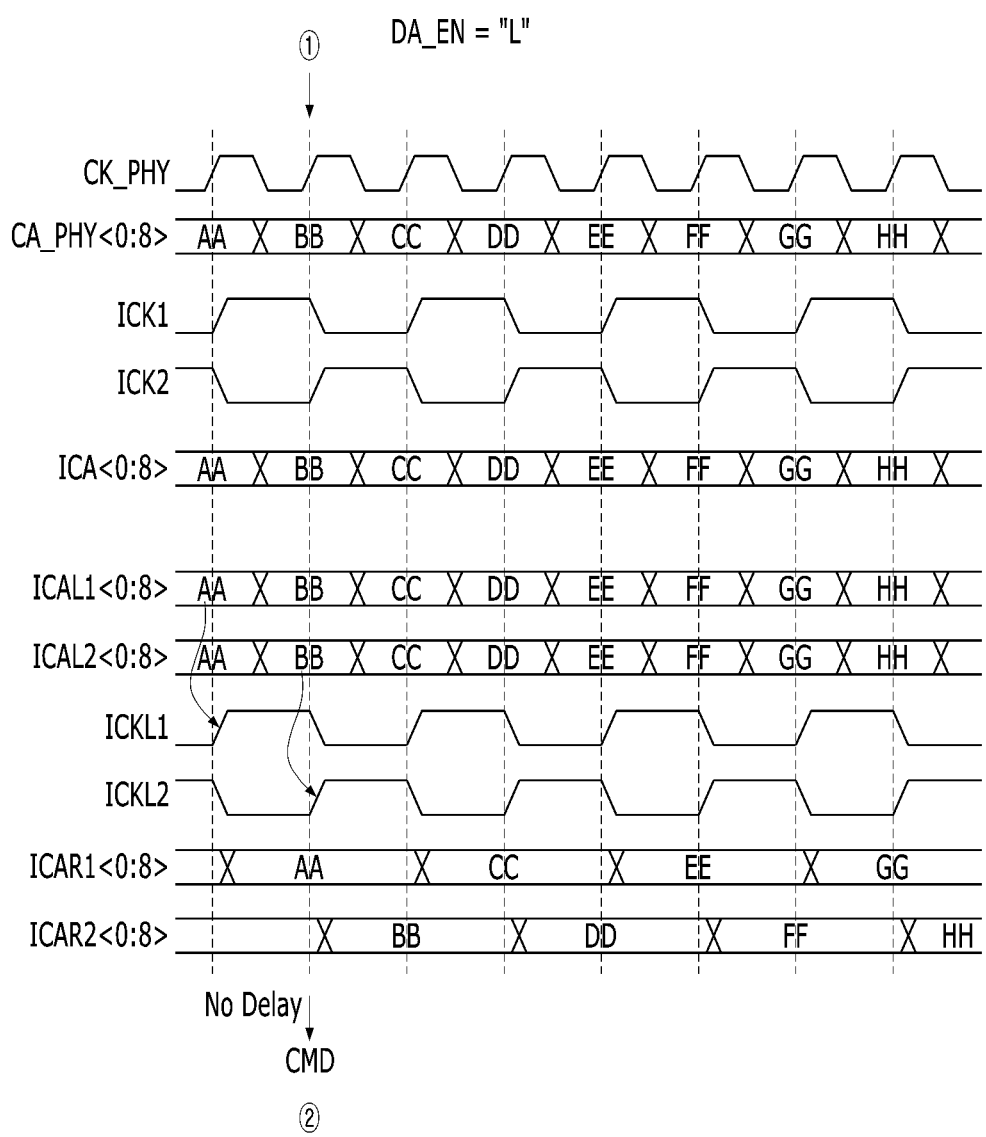
FIG. 8 is a timing diagram for describing a normal operation of a semiconductor system in accordance with various embodiments of the present invention.

FIG. 8 is a timing diagram for describing a normal operation of a semiconductor system in accordance with various embodiments of the present invention.

Referring to FIG. 8, the mode signal DA_EN may transition to a logic low level during the normal operation.

The normal control signal CA_PHY<0:8> may be inputted through the first PHY bumps PB0<0:8> from the controller 120, and the normal clock CK_PHY may be inputted through the second PHY bump PB1 from the controller 120. The controller 120 may provide the normal control signal CA_PHY<0:8> in response to a rising edge of the normal clock CK_PHY. That is, the normal control signal CA_PHY<0:8> may be transferred by a data transfer operation of a single data rate (SDR) type, during the normal operation. The second clock buffer 310 disposed in the physical area 1142 may buffer the normal clock CK_PHY to generate the internal normal clock, and the second clock generation circuit 330 may divide a frequency of the internal normal clock to generate the first and second normal divided clocks ICK1 and ICK2 having opposite phases to each other. The second data buffer 320 may buffer the normal control signal CA_PHY<0:8> to generates the buffered normal control signal ICA<0:8>.

The signal selection circuit 410 of the input signal control circuit 400 may selectively output the buffered normal control signal ICA<0:8> as the first and second selected signals ICAL1<0:8> and ICAL2<0:8>. The clock selection circuit 420 may selectively output the first normal divided clock ICK1 as the first selected clock ICKL1, and may selectively output the second normal divided clock ICK2 as the second selected clock ICKL2. The second latch circuit 430 may latch the first selected signal ICAL1<0:8> according to the first selected clock ICKL1 to output the latched signal as the first internal control signal ICAR1<0:8>, and latch the second selected signal ICAL2<0:8> according to the second selected clock ICKL2 to output the latched signal as the second internal control signal ICAR2<0:8>.

The internal signal generation circuit 500 may decode the internal control signals ICAR1<0:8> and ICAR2<0:8> to generate the internal commands/addresses ADDR_ACT_A, ADDR_PCG_A, ADDR_WT_A, ADDR_RD_A, ADDR_ACT_B, ADDR_PCG_B, ADDR_WT_B, and ADDR_RD_B. The internal signal generation circuit 500 may provide the internal commands/addresses ADDR_ACT_A, ADDR_PCG_A, ADDR_WT_A, ADDR_RD_A, ADDR_ACT_B, ADDR_PCG_B, ADDR_WT_B, and ADDR_RD_B to the through-electrodes TSVs of the TSV area 1144.

During the normal operation, two consecutive normal control signals (CA_PHY<0:8>) "AA" and "BB" may be entered. The two consecutive normal control signals "AA" and "BB" may be transferred to each core die 112, and integrated into one command/address signal CMD. At this time, the first and second internal control signals ICAR1<0:8> and ICAR2<0:8> may be provided to each core die at a time point (②) with no real delay from a time point (①) when the normal control signal (CA_PHY<0:8>) "BB" is entered.

Figure 9:
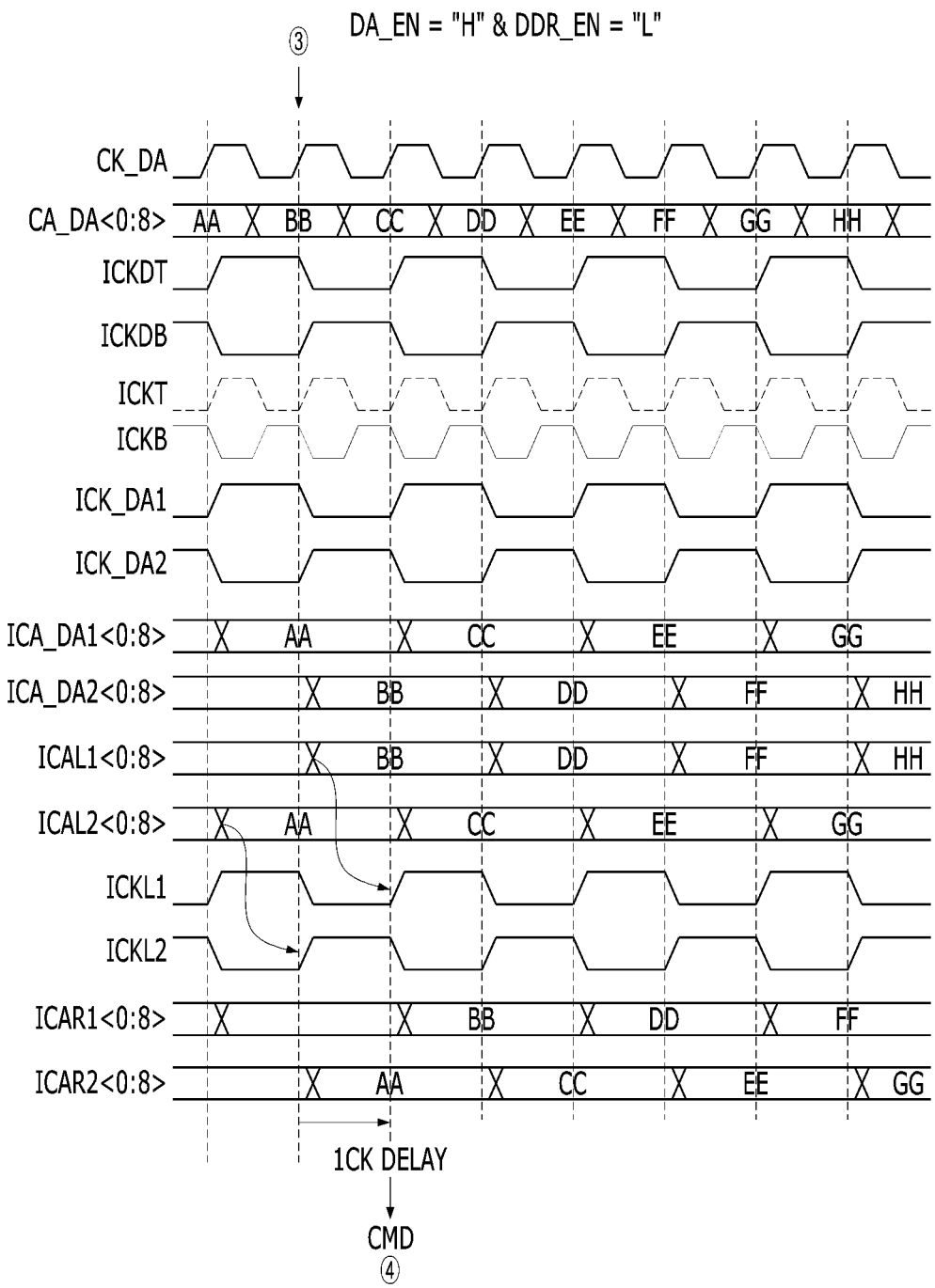
FIG. 9 is a timing diagram for describing a high-speed test operation of a semiconductor system in accordance with various embodiments of the present invention.

FIG. 9 is a timing diagram for describing a high-speed test operation of a semiconductor system in accordance with various embodiments of the present invention.

Referring to FIG. 9, the mode signal DA_EN may transition to a logic high level, and the operating information signal DDR_EN may transition to a logic low level, during the high-speed test operation.

The test control signal CA_DA<0:8> may be inputted through the first DA pads DAP0<0:8> from a test device (not shown), and the external clock CK_DA may be inputted through the second DA pad DAP1 from the test device. The test device may provide the test control signal CA_DA<0:8> in response to a rising edge of the external clock CK_DA. That is, the test control signal CA_DA<0:8> may be transferred by a data transfer operation of the SDR type, during the high-speed test operation.

The first clock generation circuit 230 disposed in the direct access area 1146 may divide a frequency of the internal clock ICK_DA to generate the first and second divided test clocks ICKDT and ICKDB, and may output the first and second divided test clocks ICKDT and ICKDB as the first and second test clocks ICK_DA1 and ICK_DA2, respectively. The first latch circuit 240 may latch the buffered test control signal ICA_DA<0:8> in response to the first and second test clocks ICK_DA1 and ICK_DA2, to output the latched signal as the first and second latched signals ICA_DA1<0:8> and ICA_DA2<0:8>. The first and second test clocks ICK_DA1 and ICK_DA2 are transferred from the direct access area 1146 to the physical area 1142, during the test operation.

The signal selection circuit 410 of the input signal control circuit 400 disposed in the physical area 1142 may selectively output the second latched signal ICA_DA2<0:8> as the first selected signal ICAL1<0:8>, and may selectively output the first latched signal ICA_DA1<0:8> as the second selected signal ICAL2<0:8>. The clock selection circuit 420 may selectively output the first test clock ICK_DA1 as the first selected clock ICKL1, and may selectively output the second test clock ICK_DA2 as the second selected clock ICKL2. The second latch circuit 430 may latch the first selected signal ICAL1<0:8> according to the first selected clock ICKL1 to output the latched signal as the first internal control signal ICAR1<0:8>, and may latch the second selected signal ICAL2<0:8> according to the second selected clock ICKL2 and output the latched signal as the second internal control signal ICAR2<0:8>.

The internal signal generation circuit 500 may decode the internal control signals ICAR1<0:8> and ICAR2<0:8> to generate the internal commands/addresses ADDR_ACT_A, ADDR_PCG_A, ADDR_WT_A, ADDR_RD_A, ADDR_ACT_B, ADDR_PCG_B, ADDR_WT_B, and ADDR_RD_B. The internal signal generation circuit 500 may provide the internal commands/addresses ADDR_ACT_A, ADDR_PCG_A, ADDR_WT_A, ADDR_RD_A, ADDR_ACT_B, ADDR_PCG_B, ADDR_WT_B, and ADDR_RD_B to the through-electrodes TSVs of the TSV area 1144.

During the high-speed test operation, when receiving the test control signal CA_DA<0:8> transferred by the data transfer operation of the SDR type from the test device, the semiconductor device can perform a data transfer operation of a DDR type using internally divided clocks. Further, when receiving the first and second latched signals ICA_DA1<0:8> and ICA_DA2<0:8> from the direct access area 1146, the semiconductor device can re-time the clock and the signal by swapping the first latched signal ICA_DA1<0:8> with the second latched signal ICA_DA2<0:8>, thereby securing the timing margin between the clock and the signal. During the high-speed test operations, two consecutive test control signals (CA_DA<0:8>) "AA" and "BB" may be entered. The two consecutive normal control signals "AA" and "BB" may be transferred to each core die 112, and integrated into one command/address signal CMD. At this time, the first and second internal control signals ICAR1<0:8> and ICAR2<0:8> may be provided to each core die at a time point (④) after 1CK delay from a time point (③) when the test control signal (CA_DA<0:8>) "BB" has been entered. In the embodiment of the present invention, a setup/hold time margin can be secured, allowing the high-speed test operation internally, although the 1CK delay may occur.

Figure 10:
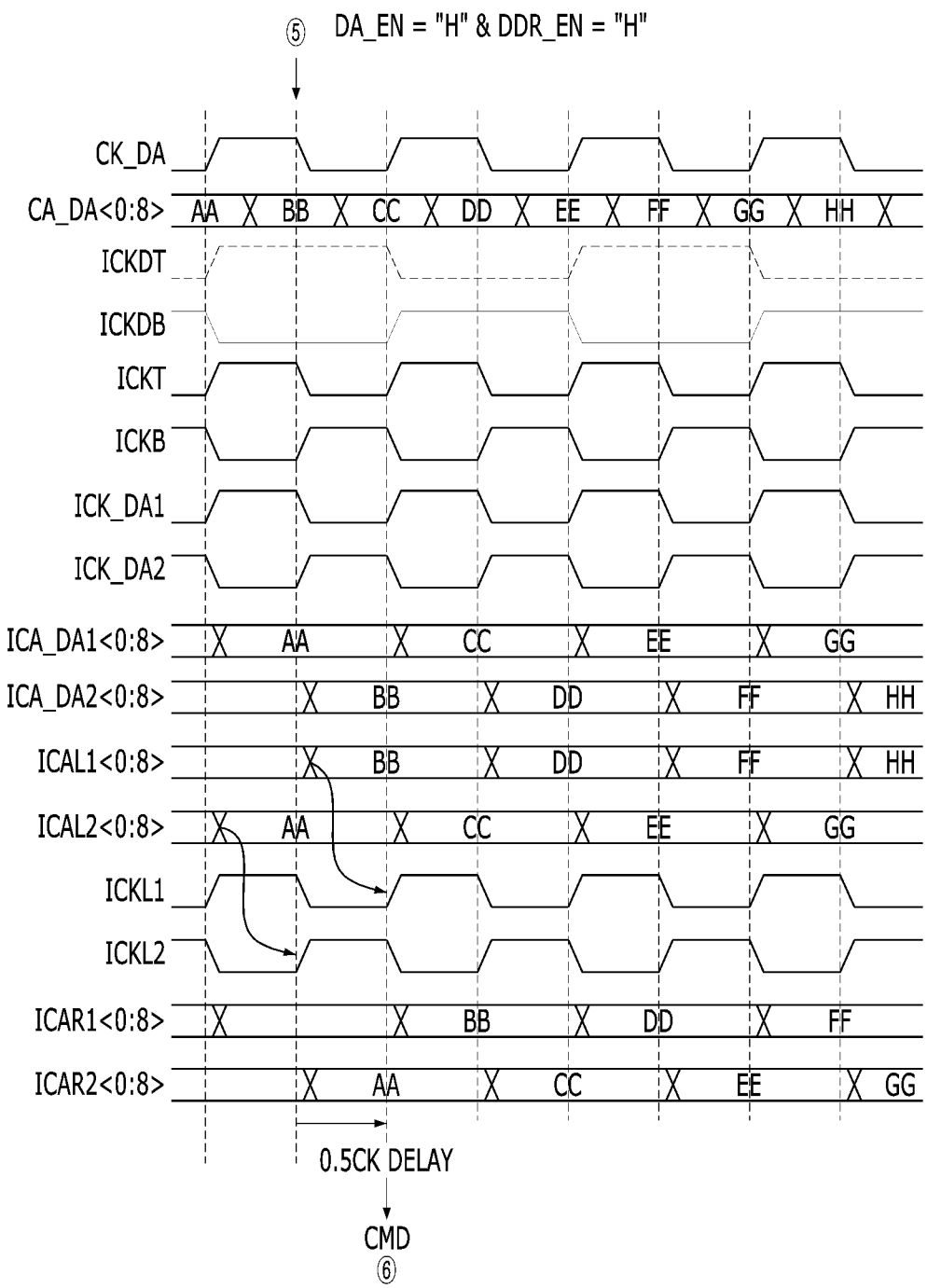
FIG. 10 is a timing diagram for describing a low-speed test operation of a semiconductor system in accordance with various embodiments of the present invention.

FIG. 10 is a timing diagram for describing a low-speed test operation of a semiconductor system in accordance with various embodiments of the present invention.

Referring to FIG. 10, the mode signal DA_EN and the operating information signal DDR_EN transition to a logic high level, during the low-speed test operation.

The test control signal CA_DA<0:8> may be inputted through the first DA pads DAP0<0:8> from a test device (not shown), and the external clock CK_DA may be inputted through the second DA pad DAP1 from the test device. The test device may provide the test control signal CA_DA<0:8> in response to rising and falling edges of the external clock CK_DA. That is, the test control signal CA_DA<0:8> may be transferred by a data transfer operation of the DDR type, during the low-speed test operation.

The first clock generation circuit 230 disposed in the direct access area 1146 may buffer the internal clock ICK_DA to generate the first and second buffer clocks ICKT and ICKB, and output the first and second test clocks ICK_DA1 and ICK_DA2, respectively. The first latch circuit 240 may latch the buffered test control signal ICA_DA<0:8> in response to the first and second test clocks ICK_DA1 and ICK_DA2, to output the first and second latched signals ICA_DA1<0:8> and ICA_DA2<0:8>. The first and second test clocks ICK_DA1 and ICK_DA2 may be transferred from the direct access area 1146 to the physical area 1142, during the test operation.

The input signal control circuit 400 disposed in the physical area 1142 may re-latch the second latched signal ICA_DA2<0:8> according to the first test clock ICK_DA1 and re-latch the first latched signal ICA_DA1<0:8> according to the second test clock ICK_DA2 to generate the internal control signals ICAR1<0:8> and ICAR2<0:8>. The internal signal generation circuit 500 may decode the internal control signals ICAR1<0:8> and ICAR2<0:8> to generate the internal commands/addresses ADDR_ACT_A, ADDR_PCG_A, ADDR_WT_A, ADDR_RD_A, ADDR_ACT_B, ADDR_PCG_B, ADDR_WT_B, and ADDR_RD_B. The internal signal generation circuit 500 may provide the internal commands/addresses ADDR_ACT_A, ADDR_PCG_A, ADDR_WT_A, ADDR_RD_A, ADDR_ACT_B, ADDR_PCG_B, ADDR_WT_B, and ADDR_RD_B to the through-electrodes TSVs of the TSV area 1144.

During the low-speed test operation, the semiconductor device may receive the test control signal CA_DA<0:8> transferred by the data transfer operation of the DDR type from the test device. When receiving the first and second latched signals ICA_DA1<0:8> and ICA_DA2<0:8> from the direct access area 1146, the semiconductor device can re-time the clock and the signal by swapping the first latched signal ICA_DA1<0:8> with the second latched signal ICA_DA2<0:8>, thereby securing the timing margin between the clock and the signal. During the low-speed test operations, two consecutive test control signals (CA_DA<0:8>) "AA" and "BB" may be entered. The two consecutive normal control signals "AA" and "BB" may be transferred to each core die 112, and integrated into one command/address signal CMD. At this time, the first and second internal control signals ICAR1<0:8> and ICAR2<0:8> are provided to each core die at a time point (⑥) after 0.5CK delay from a time point (⑤) when the test control signal (CA_DA<0:8>) "BB" has been entered. In the embodiment of the present invention, a setup/hold time margin can be secured, allowing the low-speed test operation internally, although the 0.5CK delay may occur.

Moreover, the above embodiment describes a semiconductor system with a stacked semiconductor device, but the proposed invention is not limited thereto. The following embodiment describes when the proposed invention is applied to a wide-type input/output semiconductor device with a multi-channel interface.

Figure 11:
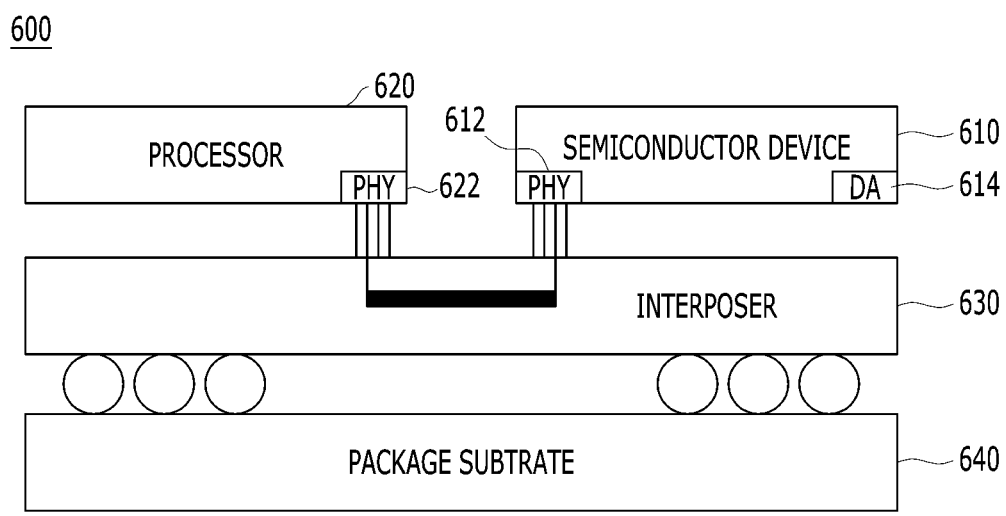
FIG. 11 is a block diagram illustrating a semiconductor system in accordance with various embodiments of the present invention.

FIG. 11 is a block diagram illustrating a semiconductor system 600 in accordance with various embodiments of the present invention.

Referring to FIG. 11, the semiconductor system 600 may include a semiconductor device 610, a controller 620, an interposer 630, and a package substrate 640. The controller 620, the interposer 630, and the package substrate 640 of FIG. 11 may have substantially the same structure and operation as the controller 120, the interposer 130 and the package substrate 140 described with reference to FIG. 1. The semiconductor device 610 of FIG. 11 may have a structure in which the base logic die (114 of FIG. 1) and the core dies (112 of FIG. 1) are integrated.

In the semiconductor devices 610, a physical area (PHY) 612 that is coupled to a physical area (PHY) 622 of the controller 620, and a direct access area (DA) 614 that is directly coupled to an external test device may be disposed. Each physical area 612 and 622 may have an interface circuit for communication between the semiconductor device 610 and the controller 620. The interface circuit may be placed in the direct access area 614 to test the semiconductor device 610.

Figure 12A:
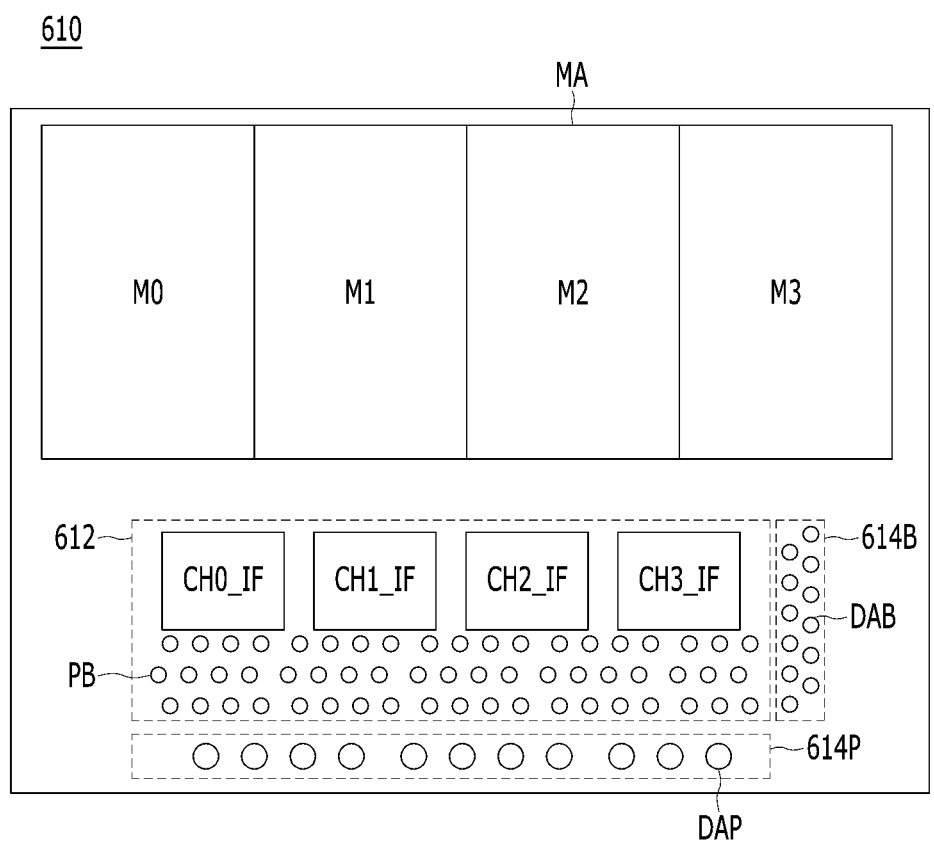
FIGS. 12A and 12B are configuration diagrams illustrating a semiconductor device of FIG. 11.
Figure 12B:
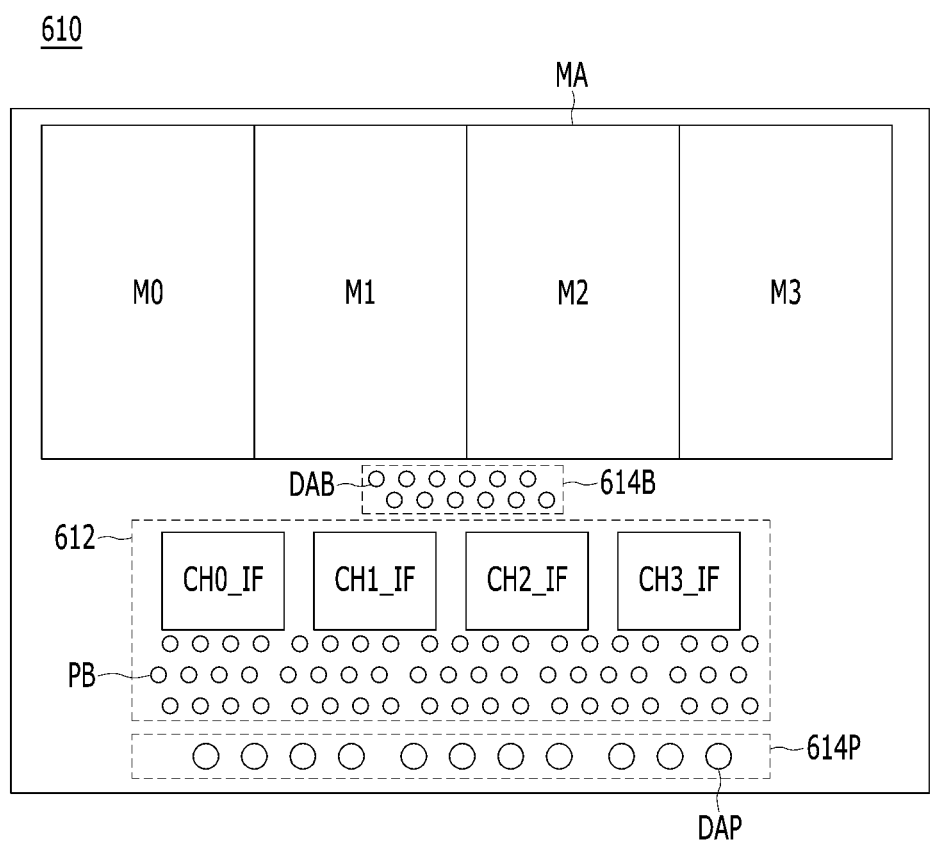

FIGS. 12A and 12B are configuration diagrams illustrating the semiconductor device 610 of FIG. 11. FIGS. 12A and 12B show that the semiconductor device 610 is implemented with a memory device.

Referring to FIGS. 12A and 12B, the semiconductor device 610 may include a memory area MA, the physical area 612 and the direct access area 614.

In the memory area MA, a plurality of sub-memory areas (e.g., first to fourth sub-memory areas M0 to M3) may be disposed. In each of the first to fourth sub-memory areas M0 to M3, a memory cell array and a peripheral circuit (not shown) for controlling an operation of the memory cell array may be disposed.

In the physical area 612, channel interface areas CH0_IF to CH3_IF for interfacing with the first to fourth sub-memory areas M0 to M3 may be disposed. A plurality of PHY bumps PB for interfacing with the controller 620 may be formed on the physical area 612.

The direct access area 614 may include a DA bump area 614B and a DA probing area 614P. In the DA bump area 614B, a plurality of DA bumps DAB for interfacing with the external test device through the interposer 630 to test the semiconductor device 610, may be formed on the direct access area 614. In the DA probing area 614P, a plurality of DA pads DAP for interfacing with the external test device without going through the interposer 630 to test the semiconductor device 610, may be formed on the direct access area 614. The PHY bumps PB and the DA bumps DB may be formed of micro-bumps, and the DA pads DAP may be formed of pad larger than the micro-bumps. For example, the DA pads DAP may be relatively larger in physical size but fewer in number than the PHY bumps PB and the DA bumps DB. In FIG. 12A, the DA probing area 614P may be formed at one side of the physical area 612, which is not facing the memory area MA in a first direction, and the DA bump area 614B may be formed at one side of the physical area 612 in a second direction. In FIG. 12B, the DA probing area 614P may be formed at one side of the physical area 612, which is not facing the memory area MA in a first direction, and the DA bump area 614B may be formed at one side of the physical area 612 in the second direction. That is, the DA bump area 614B may be formed between the memory area MA and the physical area 612. However, the concept and spirit of the present invention are not limited thereto. According to an embodiment, the DA probing area 614P and the DA bump area 614B may be disposed in various positions.

Furthermore, when entering a direct access (DA) mode to test the semiconductor device 610, a test signal may be applied through the DA bumps DAB or the DA pads DAP of the direct access area 614 to be transferred to the physical area 612. The interface circuit of the physical area 612 may transfer the applied test signal to the first to fourth sub-memory areas M0 to M3. In the embodiment, the second input circuit 300, the input signal control circuit 400 and the internal signal generation circuit 500 of FIG. 4 may be disposed in the physical area 612. The first input circuit 200 of FIG. 4 may be disposed in one of the DA probing area 614P and the DA bump area 614B of the direct access area 614. Accordingly, when the input signal control circuit 400 disposed in the physical area 612 receives first and second latched signals ICA_DA1<0:8> and ICA_DA2<0:8> which are transferred from the direct access area 614 apart therefrom, the input signal control circuit 400 may re-time (i.e., re-latch) first and second latched signals ICA_DA1<0:8> and ICA_DA2<0:8> by swapping the first latched signal ICA_DA1<0:8> with the second latched signal ICA_DA2<0:8>. Accordingly, it is possible to obtain a timing margin between the clock and the signal during a test operation. Further, the semiconductor device 610 may divide an external clock during a high-speed test operation, and may buffer the external clock during a low-speed test operation, thereby performing the high-speed test operation regardless of an operating speed of an external test device.

Figure 13:
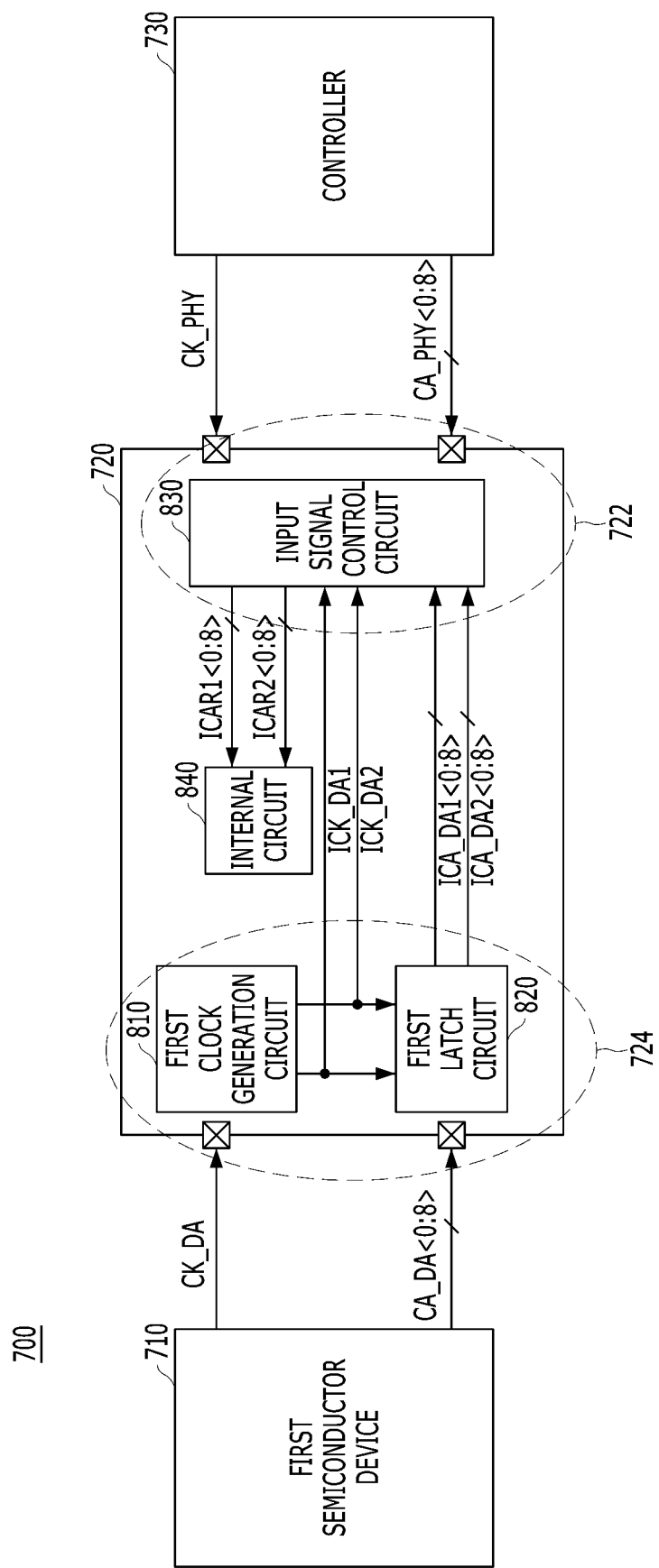
FIG. 13 is a block diagram illustrating a semiconductor system in accordance with various embodiments of the present invention.

FIG. 13 is a block diagram illustrating a semiconductor system 700 in accordance with various embodiments of the present invention.

Referring to FIG. 13, the semiconductor system 700 may include a first semiconductor device 710, a second semiconductor device 720, and a controller 730.

The first semiconductor device 710 may provide an external clock CK_DA and a test control signal CA_DA<0:8> to the second semiconductor device 720 during a test operation. The first semiconductor device 710 may transmit the test control signal CA_DA<0:8> in response to both of a rising edge and a falling edge of the external clock CK_DA, during a low-speed test operation. The first semiconductor device 710 may transmit the test control signal CA_DA<0:8> in response to any one of a rising edge and a falling edge of the external clock CK_DA, during a high-speed test operation. That is, the first semiconductor device 710 may perform a data transfer operation of a double data rate (DDR) type during the low-speed test operation, and perform a data transfer operation of a single data rate (SDR) type during the high-speed test operation. The first semiconductor device 710 may include a test device.

The controller 730 may provide a normal clock CK_PHY and a normal control signal CA_PHY<0:8> to the second semiconductor device 720 during a normal operation.

The second semiconductor device 720 may perform the test operation based on the external clock CK_DA and the test control signal CA_DA<0:8>, and perform the normal operation based on the normal clock CK_PHY and the normal control signal CA_PHY<0:8>. The controller 730 and the second semiconductor device 720 may be implemented with any embodiment of FIG. 1 and FIG. 11.

In case where the second semiconductor device 720 is a stacked semiconductor device, the second semiconductor device 720 may include a physical area 722 for interfacing with the controller 730, a TSV area (not shown) for interfacing with through-electrodes TSVs, and a direct access area 724 for interfacing with the first semiconductor device 710. When the second semiconductor device 720 is a wide-type input/output semiconductor device, the second semiconductor device 720 may include a physical area 722 for interfacing with the controller 730, and a direct access area 724 for interfacing with the first semiconductor device 710. The second semiconductor device 720 may receive the external clock CK_DA and the test control signal CA_DA<0:8> transferred from the first semiconductor device 710 to the direct access area 724, and may receive the normal clock CK_PHY and the normal control signal CA_PHY<0:8> transferred from the controller 730 to the physical area 722.

In detail, the second semiconductor device 720 may include a first clock generation circuit 810, a first latch circuit 820, an input signal control circuit 830, and an internal circuit 840. Though not shown in FIG. 13, the second semiconductor device 720 may further include a divider corresponding to the first input circuit 200 of FIG. 4, for dividing a frequency of the normal clock CK_PHY to generate first and second normal divided clocks ICK1 and ICK2, having opposite phases to each other.

The first clock generation circuit 810 may buffer the external clock CK_DA to generate first and second test clocks ICK_DA1 and ICK_DA2, during the low-speed test operation. During the high-speed test operation, the first clock generation circuit 810 may divide a frequency of the external clock CK_DA to generate the first and second test clocks ICK_DA1 and ICK_DA2. The first latch circuit 820 may latch the test control signal CA_DA<0:8> according to the first and second test clocks ICK_DA1 and ICK_DA2 to output first and second latched signals ICA_DA1<0:8> and ICA_DA2<0:8>, respectively. During the test operation, the input signal control circuit 830 may re-latch(i.e., re-time) the first and second latched signals ICA_DA1<0:8> and ICA_DA2<0:8> according to the first and second test clocks ICK_DA1 and ICK_DA2 to generate internal control signals ICAR1<0:8> and ICAR2<0:8>. During the normal operation, the input signal control circuit 830 may re-latch(i.e., re-time) the normal control signal CA_PHY<0:8> according to the first and second normal divided clocks ICK1 and ICK2 to generate internal control signals ICAR1<0:8> and ICAR2<0:8>. The input signal control circuit 830 of FIG. 13 may be substantially the same as the input signal control circuit 400 of FIG. 4. The internal circuit 840 may perform an internal operation based on the internal control signals ICAR1<0:8> and ICAR2<0:8>. For example, the internal circuit 840 may include the internal signal generation circuit 500 of FIG. 4.

In accordance with the embodiment of the present invention, the first clock generation circuit 810 and the first latch circuit 820 may be disposed in the direct access area 724, while the input signal control circuit 830 may be disposed in the physical area 722. Thus, when transferring the first and second latched signals ICA_DA1<0:8> and ICA_DA2<0:8> to the physical area 722 from the direct access area 724, the input signal control circuit 830 may re-time the clock and the signal by swapping the first latched signal ICA_DA1<0:8> with the second latched signal ICA_DA2<0:8> during the test operation. Accordingly, the second semiconductor device 720 may secure the timing margin between the clock and the signal. Further, the second semiconductor device 720 may divide an external clock during a high-speed test operation, and may buffer the external clock during a low-speed test operation, thereby performing the high-speed test operation regardless of an operating speed of an external test device.

According to the embodiments of the present invention, the semiconductor device may improve the reliability of the semiconductor device by re-timing the signals externally provided in a DA mode.

While the present invention has been described with respect to the specific embodiments, it will be apparent to those skilled in the art that various changes and modifications may be made without departing from the spirit and scope of the invention as defined in the following claims.

For example, the logic gates and transistors described in the above embodiments may have different positions and types according to the polarity of input signals.

What is claimed is:

1. A stacked semiconductor device, comprising:
a plurality of semiconductor chips that are stacked and transfer signals through a plurality of through-electrodes,
wherein at least one of the semiconductor chips comprises:
a first clock generation circuit suitable for generating first and second test clocks by dividing or buffering an external clock according to an operating information signal for indicating a high-speed test operation and a low-speed test operation;
a first latch circuit suitable for latching a test control signal according to the first and second test clocks to generate first and second latched signals; and
an input signal control circuit suitable for generating first and second internal control signals by re-latching the second latched signal according to the first test clock, and re-latching the first latched signal according to the second test clock.

2. The stacked semiconductor device of claim 1,
wherein the at least one of the semiconductor chips includes a first area suitable for interfacing with a controller, a second area suitable for interfacing with the through-electrodes, and a third area suitable for interfacing with a test device, and
wherein the at least one of the semiconductor chips receives the external clock and the test control signal through the third area, and receives a normal clock and a normal control signal through the first area.

3. The stacked semiconductor device of claim 2, wherein the third area includes:
a bump area on which a plurality of bumps suitable for interfacing with the test device to test the stacked semiconductor device of a package level are formed; and
a pad area on which a plurality of probing pads suitable for interfacing with the test device to test the stacked semiconductor device of a wafer level are formed.

4. The stacked semiconductor device of claim 2,
wherein the first clock generation circuit and the first latch circuit are disposed in the third area, and
wherein the input signal control circuit is disposed in the first area.

5. The stacked semiconductor device of claim 1, wherein the first clock generation circuit includes:
a divider suitable for dividing a frequency of the external clock to generate first and second divided test clocks having opposite phases to each other;
a first transmitter suitable for transferring the external clock as a first buffer clock;
a second transmitter suitable for transferring a second buffer clock by inverting the external clock; and
a selector suitable for, in response to the operating information signal, selecting one of the first divided test clock and the first buffer clock to output as the first test clock, and selecting one of the second divided test clock and the second buffer clock to output as the second test clock.

6. The stacked semiconductor device of claim 1, wherein the at least one of the semiconductor chips further includes:
a frequency divider suitable for dividing a frequency of a normal clock provided from a controller to generate first and second normal divided clocks.

7. The stacked semiconductor device of claim 6, wherein the input signal control circuit includes:
a signal selection circuit suitable for, according to a mode signal for indicating a test operation and a normal operation, selecting one of a normal control signal provided from the controller and the second latched signal to output as a first selected signal, and selecting one of the normal control signal and the first latched signal to output as a second selected signal;
a clock selection circuit suitable for, according to the mode signal, selecting one of the first normal divided clock and the first test clock to output as a first selected clock, and selecting one of the second normal divided clock and the second test clock to output as a second selected clock; and
a second latch circuit suitable for latching the first selected signal according to the first selected clock to output the first internal control signal, and latching the second selected signal according to the second selected clock to output the second internal control signal.

8. The stacked semiconductor device of claim 1, wherein the at least one of semiconductor chips further includes:
a decoding circuit suitable for decoding the first and second internal control signal to generate a plurality of internal commands; and
a command/address generation circuit suitable for generating a plurality of internal commands/addresses corresponding to the first and second internal control signal according to the internal commands, and transferring the internal commands/addresses to the through-electrodes.

9. A semiconductor system, comprising:
a first semiconductor device suitable for providing a test control signal in synchronization with an external clock, during a test operation; and
a second semiconductor device suitable for performing the test operation based on the external clock and the test control signal,
wherein the second semiconductor device comprises:

a first clock generation circuit suitable for generating a first test clock by dividing an external clock during a low-speed test operation, and a second test clock by buffering the external clock during a high-speed test operation;

a first latch circuit suitable for latching the test control signal according to the first and second test clocks to generate first and second latched signals; and an input signal control circuit suitable for generating first and second internal control signals by re-latching the second latched signal according to the first test clock, and re-latching the first latched signal according to the second test clock.

10. The semiconductor system of claim 9,
wherein the first semiconductor device provides the test control signal in response to one of a rising edge and a falling edge of the external clock during the high-speed test operation, and
wherein the first semiconductor device provides the test control signal in response to both of the rising edge and the falling edge of the external clock during the low-speed test operation.

11. The semiconductor system of claim 9, further comprising:
a controller suitable for providing a normal control signal and a normal clock for the second semiconductor device to perform a normal operation.

12. The semiconductor system of claim 11,
wherein the second semiconductor device includes a first area suitable for interfacing with the controller and a third area suitable for interfacing with the first semiconductor device, and
wherein the second semiconductor device receives the external clock and the test control signal through the third area, and receives the normal clock and the normal control signal through the first area.

13. The semiconductor system of claim 12,
wherein the first clock generation circuit and the first latch circuit are disposed in the third area, and
wherein the input signal control circuit is disposed in the first area.

14. The semiconductor system of claim 11,
wherein the second semiconductor device includes a plurality of semiconductor chips that are stacked and transfer signals through a plurality of through-electrodes, and
wherein the first clock generation circuit, the first latch circuit, and the input signal control circuit are disposed in at least one of the semiconductor chips.

15. The semiconductor system of claim 14,
wherein the at least one of the semiconductor chips includes a first area suitable for interfacing with the controller, a second area suitable for interfacing with the through-electrodes, and a third area suitable for interfacing with the first semiconductor device, and
wherein the at least one of the semiconductor chips receives the external clock and the test control signal through the third area, and receives the normal clock and the normal control signal through the first area.

16. The semiconductor system of claim 15,
wherein the first clock generation circuit and the first latch circuit are disposed in the third area, and
wherein the input signal control circuit is disposed in the first area.

17. The semiconductor system of claim 9, wherein the input signal control circuit includes:

a signal selection circuit suitable for, according to a mode signal for indicating the test operation and a normal operation, selecting one of a normal control signal and the second latched signal to output as a first selected signal, and selecting one of the normal control signal and the first latched signal to output as a second selected signal;

a clock selection circuit suitable for, according to the mode signal, selecting one of the first normal divided clock and the first test clock to output as a first selected clock, and selecting one of the second normal divided clock and the second test clock to output as a second selected clock; and a second latch circuit suitable for latching the first selected signal according to the first selected clock to output the first internal control signal, and latching the second selected signal according to the second selected clock to output the second internal control signal.

18. The semiconductor system of claim 9, wherein the first clock generation circuit includes:
a divider suitable for dividing a frequency of the external clock to generate first and second divided test clocks having opposite phases to each other;
a first transmitter suitable for transferring the external clock as a first buffer clock;
a second transmitter suitable for transferring a second buffer clock by inverting the external clock; and
a selector suitable for, in response to an operating information signal for indicating the high-speed test operation and the low-speed test operation, selecting one of the first divided test clock and the first buffer clock to output as the first test clock, and selecting one of the second divided test clock and the second buffer clock to output as the second test clock.

19. The semiconductor system of claim 9, wherein the second semiconductor device further includes:
a decoding circuit suitable for decoding the first and second internal control signal to generate a plurality of internal commands; and
a command/address generation circuit suitable for generating a plurality of internal commands/addresses corresponding to the first and second internal control signal according to the internal commands.

20. A method for testing a stacked semiconductor device using an external clock and a test control signal in synchronization with the external clock, which are provided from an external test device, the method comprising:
buffering the external clock during a low-speed test operation to generate first and second test clocks, or dividing a frequency of the external clock during a high-speed test operation to generate the first and second test clocks having opposite phases to each other;
latching the test control signal according to the first test clock to generate a first latched signal;
latching the test control signal according to the second test clock to generate a second latched signal;
re-latching the second latched signal according to the first test clock to generate a first internal control signal;
re-latching the first latched signal according to the second test clock to generate a second internal control signal; and
operating the stacked semiconductor device based on the first and second internal control signals to perform the low-speed test operation or the high-speed test operation.

* * * * *